(12) United States Patent
Wright et al.

(10) Patent No.: US 11,481,062 B1
(45) Date of Patent: Oct. 25, 2022

(54) SOLID-STATE TOUCH-ENABLED SWITCH AND RELATED METHOD

(71) Applicant: UltraSense Systems, Inc., San Jose, CA (US)

(72) Inventors: Andrew Jonathan Wright, Fremont, CA (US); Hao-Yen Tang, San Jose, CA (US); Chien-Te Lee, Zhubei (TW); Mo Maghsoudnia, San Jose, CA (US)

(73) Assignee: UltraSense Systems, Inc., San Jose, CA (US)

( * ) Notice: Subject to any disclaimer, the term of this patent is extended or adjusted under 35 U.S.C. 154(b) by 0 days.

(21) Appl. No.: 17/713,894

(22) Filed: Apr. 5, 2022

Related U.S. Application Data

(60) Provisional application No. 63/309,879, filed on Feb. 14, 2022.

(51) Int. Cl.
*G06F 3/01* (2006.01)
*G06F 3/041* (2006.01)

(52) U.S. Cl.
CPC ............ *G06F 3/0414* (2013.01); *G06F 3/016* (2013.01); *G06F 3/0416* (2013.01)

(58) Field of Classification Search
CPC .. G06F 3/016; G06F 3/03; H03K 2217/96011
See application file for complete search history.

(56) References Cited

U.S. PATENT DOCUMENTS

| | | | |
|---|---|---|---|
| 4,412,544 A | 11/1983 | Beretsky et al. | |
| 8,648,837 B1 * | 2/2014 | Tran | G06F 3/0442 345/157 |
| 8,676,540 B1 | 3/2014 | Welch et al. | |
| 9,389,769 B1 * | 7/2016 | O'Keeffe | G02B 6/0078 |
| 10,466,844 B1 | 10/2019 | Tang et al. | |
| 10,585,534 B2 | 3/2020 | Tang et al. | |
| 10,606,355 B1 * | 3/2020 | Zhang | G06F 3/046 |
| 10,719,175 B2 | 7/2020 | Akhbari et al. | |
| 10,775,938 B2 | 9/2020 | Tang et al. | |
| 2001/0000666 A1 | 5/2001 | Wood et al. | |
| 2002/0005108 A1 | 1/2002 | Ludwig | |
| 2003/0144814 A1 | 7/2003 | Hama et al. | |

(Continued)

FOREIGN PATENT DOCUMENTS

WO WO2018077761 5/2018

*Primary Examiner* — Ryan A Lubit
(74) *Attorney, Agent, or Firm* — Perkins Coie LLP

(57) ABSTRACT

A solid-state switch for an external system includes a cover member, a first solid-state transducer, a microcontroller, a user feedback device, and a switching circuit. The first transducer is mechanically coupled to the cover member and configured to generate first signals in response to a perturbation at the cover member. The microcontroller is configured to obtain first data from the first signals and determine user inputs in accordance with at least the first data and an operational state of the solid-state switch. The user feedback device is configured to provide feedback to a user of the solid-state switch in accordance with a switching behavior of the switching circuit. The microcontroller is couplable to a master controller of the external system. The switching behavior of the switching circuit is determined in accordance with: (a) the commands from the master controller to the microcontroller, and/or (b) user inputs as determined by the microcontroller.

30 Claims, 13 Drawing Sheets

(56) References Cited

U.S. PATENT DOCUMENTS

| | | |
|---|---|---|
| 2003/0217873 A1 | 11/2003 | Paradiso et al. |
| 2003/0233233 A1 | 12/2003 | Hong |
| 2007/0260425 A1 | 11/2007 | Kim |
| 2008/0316184 A1 | 12/2008 | D'Souza |
| 2009/0157206 A1 | 6/2009 | Weinberg et al. |
| 2009/0224161 A1 | 9/2009 | Fritsch et al. |
| 2010/0117993 A1 | 5/2010 | Kent |
| 2010/0139991 A1 | 6/2010 | Phillip et al. |
| 2010/0258361 A1 | 10/2010 | Yamauchi et al. |
| 2011/0061464 A1 | 3/2011 | Yi-min |
| 2012/0274609 A1 | 11/2012 | Sheng et al. |
| 2013/0345864 A1 | 12/2013 | Park et al. |
| 2014/0019913 A1* | 1/2014 | Newman ............... G06F 3/0488 715/810 |
| 2014/0022189 A1 | 1/2014 | Sheng et al. |
| 2014/0071095 A1 | 3/2014 | Godsill |
| 2015/0148674 A1 | 5/2015 | Park et al. |
| 2015/0169136 A1 | 6/2015 | Ganti et al. |
| 2015/0290545 A1* | 10/2015 | Barney .................. A63F 13/21 463/31 |
| 2016/0216794 A1 | 7/2016 | Yoon et al. |
| 2016/0246396 A1* | 8/2016 | Dickinson ........... G06F 3/03545 |
| 2016/0246449 A1 | 8/2016 | Jarske |
| 2017/0110504 A1 | 4/2017 | Panchawagh et al. |
| 2017/0255338 A1 | 9/2017 | Medina |
| 2017/0322290 A1 | 11/2017 | Ng et al. |
| 2017/0336903 A1 | 11/2017 | Rivaud et al. |
| 2017/0336926 A1 | 11/2017 | Chaudhri et al. |
| 2018/0032161 A1 | 2/2018 | Shi et al. |
| 2018/0032211 A1 | 2/2018 | King |
| 2018/0039392 A1 | 2/2018 | Kim et al. |
| 2018/0164937 A1 | 6/2018 | Lynn |
| 2018/0246612 A1 | 8/2018 | Lynn et al. |
| 2018/0276439 A1 | 9/2018 | Strohmann et al. |
| 2018/0276440 A1 | 9/2018 | Strohmann et al. |
| 2018/0284892 A1 | 10/2018 | Kwon et al. |
| 2018/0323783 A1 | 11/2018 | Bang et al. |
| 2019/0050618 A1 | 2/2019 | Khuri-Yakub |
| 2019/0074833 A1 | 3/2019 | Sheng |
| 2019/0278454 A1* | 9/2019 | Washeleski ......... G06F 3/04886 |
| 2019/0354209 A1 | 11/2019 | Tang et al. |
| 2019/0354210 A1 | 11/2019 | Akhbari et al. |
| 2019/0354237 A1 | 11/2019 | Tang et al. |
| 2019/0354238 A1* | 11/2019 | Akhbari ............... G06N 3/0445 |
| 2020/0348794 A1* | 11/2020 | Ralston ................ G06F 1/3231 |
| 2020/0379593 A1* | 12/2020 | de Vries ............. G06F 3/04842 |
| 2021/0181041 A1 | 6/2021 | Tang |
| 2021/0242393 A1 | 8/2021 | Tang |
| 2021/0278926 A1 | 9/2021 | Akhbari et al. |
| 2021/0293641 A1 | 9/2021 | Tu et al. |
| 2021/0293648 A1 | 9/2021 | Tu et al. |
| 2022/0019310 A1* | 1/2022 | Nelson ................ H03K 17/962 |

* cited by examiner

SOLID-STATE TOUCH-ENABLED SWITCH AND RELATED METHOD

CROSS-REFERENCE TO RELATED APPLICATION(S)

This application claims the benefit of U.S. Provisional Patent Application No. 63/309,879 filed on Feb. 14, 2022, entitled SOLID-STATE TOUCH-ENABLED SWITCH AND RELATED METHOD, which is incorporated herein by reference in its entirety.

BACKGROUND

In some use cases, it is desirable to make switches of electronic systems weatherproof, e.g., sealed against moisture dust. For example, some electronic systems, such as solar-power systems, are placed outdoors. Weatherproof switches would be attractive for such outdoor electronic systems. It is feasible but quite cumbersome or costly to seal a mechanical switch against moisture and dust because of the mechanical moving parts. Additionally, the movable parts in a mechanical switch undergo degradation upon repeated use and exposure to the outside elements. On the other hand, solid-state transducers can be made using microelectromechanical systems (MEMS) technologies. Solid-state transducers can enable a more simplified approach to weatherproof switches. A solid-state transducer does not need any moving parts, other than an active material that might undergo mechanical deformation at the micrometer level (or less). Accordingly, the probability of material fatigue and failure is reduced. Additionally, by using MEMS and CMOS (complementary metal-oxide semiconductor) processing technologies, solid-state transducers, analog front-end processors, and microcontrollers can be integrated into one integrated circuit (IC) device.

SUMMARY OF THE INVENTION

In one aspect, a solid-state switch for an external system includes a cover member, a first solid-state transducer, a microcontroller, a user feedback device, and a switching circuit. The first solid-state transducer is mechanically coupled to the cover member and configured to generate first signals in response to a perturbation at the cover member. The microcontroller is configured to obtain first data from the first signals and determine user inputs in accordance with at least the first data and an operational state of the solid-state switch. The user feedback device is configured to be powered by a power supply via the switching circuit. The user feedback device is configured to provide feedback to a user of the solid-state switch in accordance with a switching behavior of the switching circuit. The microcontroller is couplable by a digital bus to a master controller of the external system. The switching behavior of the switching circuit is determined in accordance with either one or both of the following: (a) commands from the master controller to the microcontroller, and (b) user inputs as determined by the microcontroller.

In another aspect, a method of switching an external system using a solid-state switch is disclosed. The method includes (A1), (A2), (A3), (A4), (A5), and (A6). (A1) includes generating, by a first solid-state transducer, first signals in response to a perturbation at a cover member. The first solid-state transducer is mechanically coupled to the cover member. (A2) includes obtaining, by a microcontroller, first data from the first signals. (A3) includes determining, by the microcontroller, user inputs in accordance with at least the first data and an operational state of the solid-state switch. (A4) includes transmitting, by the microcontroller, at least one of the user inputs via a digital bus to a master controller of the external system. (A5) includes powering, by a power supply, a user feedback device via a switching circuit. (A6) includes providing, by the user feedback device, feedback to a user of the solid-state switch in accordance with the switching behavior of the switching circuit. The switching behavior of the switching circuit is determined in accordance with either one or both of the following: (a) commands from the master controller to the microcontroller, and (b) user inputs as determined by the microcontroller. The solid-state switch includes the cover member, the first solid-state transducer, the microcontroller, the user feedback device, and the switching circuit.

The above summary of the present invention is not intended to describe each disclosed embodiment or every implementation of the present invention. The description that follows more particularly exemplifies illustrative embodiments. In several places throughout the application, guidance is provided through examples, which examples can be used in various combinations. In each instance of a list, the recited list serves only as a representative group and should not be interpreted as an exclusive list.

BRIEF DESCRIPTION OF THE FIGURES

The disclosure may be more completely understood in consideration of the following detailed description of various embodiments of the disclosure in connection with the accompanying drawings, in which.

DETAILED DESCRIPTION OF ILLUSTRATIVE EMBODIMENTS

The present disclosure relates to user-input systems, user-input modules, and methods of detecting a user-input at a cover member of a user-input system.

In this disclosure:

The words "preferred" and "preferably" refer to embodiments of the invention that may afford certain benefits, under certain circumstances. However, other embodiments may also be preferred, under the same or other circumstances. Furthermore, the recitation of one or more preferred embodiments does not imply that other embodiments are not useful and is not intended to exclude other embodiments from the scope of the invention.

The terms "comprises" and variations thereof do not have a limiting meaning where these terms appear in the description and claims.

Unless otherwise specified, "a," "an," "the," and "at least one" are used interchangeably and mean one or more than one.

The recitations of numerical ranges by endpoints include all numbers subsumed within that range (e.g., 1 to 5 includes 1, 1.5, 2, 2.75, 3, 3.80, 4, 5, etc.).

For any method disclosed herein that includes discrete steps, the steps may be conducted in any feasible order. As appropriate, any combination of two or more steps may be conducted simultaneously.

Figure 1:
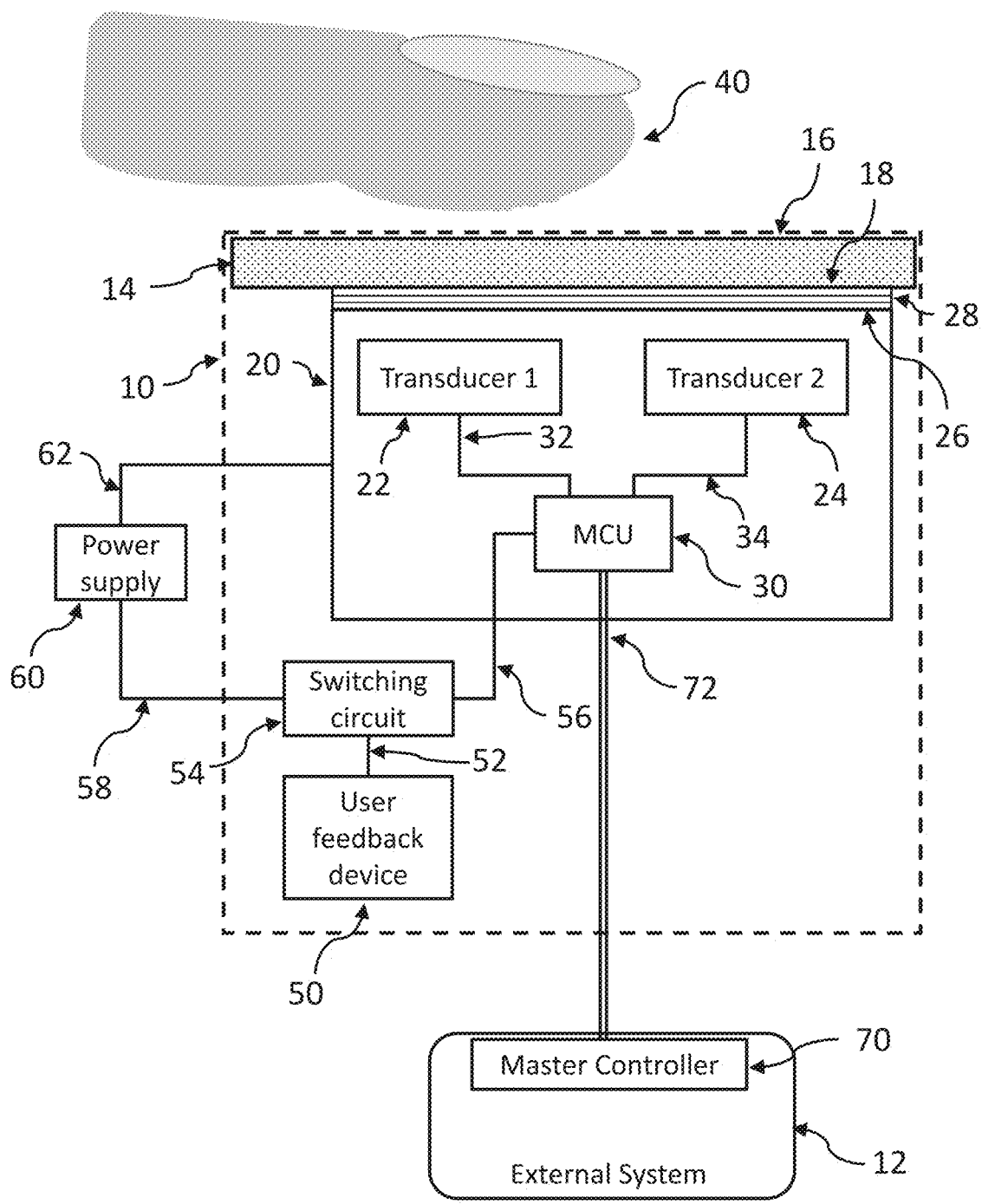
FIG. 1 is a schematic block diagram of an implementation of a solid-state switch for an external system.

FIG. 1 is a schematic block diagram of an implementation of a solid-state switch 10 for an external system 12. The external system 12 can be any electronic system external to the solid-state switch 10 that can be switched using input from the solid-state switch 10. For example, the external system can be a solar-power system. In the example shown, solid-state switch 10 includes a cover member 14. The cover member 14 has an outer surface 16, which faces outwards and is a portion of the outer surface of the solid-state switch 10. The cover member 14 has an inner surface 18 opposite the outer surface 16. In the example shown, the solid-state switch 10 includes transducer IC 20 including a first solid-state transducer 22, a second transducer 24, and a micro-controller (MCU) 30. In other examples, a transducer IC may have one transducer or more than two transducers. In a preferred implementation, the solid-state transducers (22, 24) can be fabricated using MEMS technologies, and the MCU 30 can be fabricated using CMOS technologies. For example, the MEMS and CMOS chips can be assembled into a packaged transducer IC 20. In the example shown, the MCU 30 is electrically connected to the first solid-state transducer 22 via an interconnection 32 and to the second transducer 24 via an interconnection 34.

FIG. 1 shows a mechanical coupling surface 26 of the IC 20, which is the surface that is attached to the inner surface 18 of the solid-state switch via an adhesive 28. The adhesive 28 could be double-sided tape, pressure sensitive adhesive (PSA), epoxy adhesive, or acrylic adhesive, for example. Accordingly, the solid-state transducers 22, 24 are mechanically coupled to the cover member 14. In some implementations, solid-state transducers 22, 24 are mechanically coupled to the cover member 14 in the sense that a mechanical deformation of the cover member 14 is transmitted to the solid-state transducers 22, 24. During operation, a perturbation may occur at the outer surface 16 of the cover member 14. We refer to any event detectable via one or more of the transducers as a perturbation. In the example shown, the perturbation includes a touch event in which a finger 40 touches or presses the cover member 14 at the outer surface 16. In other cases, a perturbation may also include another object (e.g., water droplet or a rock) hitting the cover member 14. In yet other cases, a perturbation may include a finger 40 hovering close to or in contact with the outer surface, detectable by measurements of capacitance via sensor electrode(s), as described herein. In some cases, the perturbation at the cover member can include a mechanical deformation at the cover member.

In the example shown in FIG. 1, the mechanical coupling surface 26 is the "top surface" of the transducer IC 20, closer to the solid-state transducers 22, 24 than to the MCU 30. However, in other implementations the mechanical coupling surface 26 can be the "bottom surface" of the transducer IC 20, closer to the MCU 30 than to the solid-state transducers 22, 24. In the example shown in FIG. 1, the mechanical coupling surface 26 is coupled to the cover member 14 via an adhesive layer 28. In some implementations, there may be one or more additional intervening layers between the mechanical coupling surface 26 and the cover member 14. For example, the transducer IC 20 can be mounted to a circuit substrate (e.g., a flexible circuit substrate), and the circuit substrate can be adhered to the cover member 14 via an adhesive layer. In such a case, any mechanical deformation at the cover member would be transmitted via the adhesive layer, the circuit substrate, and then to the transducer IC.

In the example shown in FIG. 1, the solid-state switch includes a user feedback device 50. The user feedback device 50 can be any device that can be configured to provide feedback to a user of the solid-state switch. For example, the user can be a person whose finger 40 is shown. The feedback to the user can include: (1) an acknowledgement that a user input (e.g., turn external system ON, turn external system OFF) has been received and recognized, or (2) information about the status of the external system 12. The feedback to the user can be in a form of a pattern of visible light visible to the user, haptic feedback that can be felt by the user (e.g., via the finger 40 of the user), and/or a sound pattern (e.g., words or sentences) that can be heard by the user. The user feedback device 50 can include a visible light-emitting element, a haptic transducer, and/or an audible sound emitting element. A visible light-emitting element can be used to produce a pattern of visible light. A haptic transducer can be used to produce haptic feedback. An audible sound-emitting element can produce a sound pattern (e.g., words, sentences, melodies, alarm sounds).

The pattern of visible light can include one or more of the following: a pattern of visible light of varying intensities, a pattern of visible light of varying mixtures of colors, and a pattern of visible light of varying intensities and varying mixtures of colors. The visible light-emitting element can be a solid-state light-emitting element, such as a light-emitting diode or a laser diode. The user feedback device 50 can include multiple visible light-emitting elements. For example, the user feedback device 50 can include a red light-emitting element, a green light-emitting element, and a blue light-emitting element. By controlling the timing of turning on of each of these light-emitting elements, a pattern of visible light of varying mixtures of colors can be obtained. For example, a pattern of visible light of varying intensities can be produced from a visible light-emitting element by modulating (e.g., by pulse-width modulation) the electrical current (electrical power) to that visible light-emitting element.

In the example shown in FIG. 1, power supply 60 supplies electrical power to transducer IC 20 (via wiring 62) and a switching circuit 54 (via wiring 58). In one implementation, the power supply 60 can be a mains power supply, outside of the solid-state switch 10. In other implementations, the power supply 60 can be a portable power supply (e.g., a small battery), incorporated inside the solid-state switch 10. In the example shown in FIG. 1, the power supply 60 is not configured as a power supply for external system 12.

Accordingly, the solid-state switch 10 can continue to operate even when a power supply to the external system 12 is interrupted. In the example shown in FIG. 1, the solid-state switch 10 additionally includes the switching circuit 54, electrically coupled to the user feedback device 50 (via wiring 52), the MCU 30 (via wiring 56), and the power supply 60 (via wiring 58). The user feedback device 50 is configured to be powered by a power supply 60 via the switching circuit 52. The user feedback device 50 is configured to provide feedback to a user of the solid-state switch 10 in accordance with a switching behavior of the switching circuit 54. For example, the user feedback device 50 can include a red light-emitting diode (LED) and a blue LED. In this example, the red LED and blue LED can produce a pattern of red and blue light of varying intensities (e.g., red light ON, blue light ON, both red and blue lights ON, red light rapidly pulsing ON and OFF, and blue light rapidly pulsing ON and OFF) in accordance with a switching behavior of the switching circuit. In this example, each pattern of red and blue light can correspond to respective feedback to the user.

In the example shown in FIG. 1, the first solid-state transducer 22 is mechanically coupled to the cover member 14 and is configured to generate first signals in response to a perturbation at the cover member. For example, the first solid-state transducer 22 can include a piezoelectric micromechanical force-measuring element (PMFE) and an analog front-end (AFE) circuitry connected to the PMFE. As explained in detail herein, a PMFE is an example of a strain-sensing element. A PMFE is a transient strain-sensing element that is sensitive to the time-varying strain, unlike other strain-sensing elements such as a strain gauge. In some implementations, the AFE circuitry can include an amplifier that amplifies and conditions the signals output by the PMFE to produce an amplified analog signal and an analog-to-digital converter (ADC) that converts the amplified analog signal to a digital signal.

In the example shown in FIG. 1, the solid-state switch 10 additionally includes a second transducer 24. In this example, the second transducer 24 is included in the transducer IC 20. In some implementations, the second transducer is a solid-state transducer and is included in the transducer IC 20. In some implementations, the second transducer is not a solid-state transducer and is not included in the transducer IC 20. In the example shown in FIG. 1, the second solid-state transducer 24 is mechanically coupled to the cover member 14 and is configured to generate second signals in response to the perturbation at the cover member. The second solid-state transducer 24 can include a same type of transducer element as the first solid-state transducer 22 or can include a different type of transducer element. For example, the first solid-state transducer 22 and the second solid-state transducer 24 can both include a respective PMFE. In some implementations, the first solid-state transducer 22 can include a PMFE and the second solid-state transducer 24 can include a piezoelectric micromechanical ultrasonic transducer (PMUT). In some implementations, the first solid-state transducer 22 can include a PMFE and the second solid-state transducer 24 can include one or more sensor electrodes, e.g., for capacitance measurements. In some implementations, by employing two or more measurement mechanisms (e.g., PMFEs and PMUTs, PMFEs and capacitance sensing), it may be possible to reduce or eliminate false triggers in determining user inputs. In some implementations, other types of transducer/sensor elements can be used. Other possible transducer/sensor elements include temperature sensors, inductance sensors, and strain gauges. Other transducer/sensor elements can provide additional information about user input or the surrounding environment, for example. In some implementations, a transducer/sensor element can be implemented as a solid-state element. In some implementations, a transducer/sensor element can be implemented as a solid-state element and be incorporated into the transducer IC 20. In some implementations, a transducer/sensor element can be implemented as a solid-state element and be mounted on a circuit board substrate (e.g., 112 in FIG. 2) inside the solid-state switch 10, separate from the transducer IC 20. In some implementations, a transducer/sensor element can be implemented as a non-solid-state element (e.g., an element comprising mechanical parts that move in response to an input) and be incorporated into the solid-state switch 10. Some transducer/sensor elements (e.g., PMFE) need to be mechanically coupled to the cover member but some other transducer/sensor elements (e.g., temperature sensor) need not be mechanically coupled to the cover member.

In some implementations, the microcontroller (MCU) 30 is configured to obtain first data from the first signals (generated by and received from the first solid-state transducer 22) and to determine a user input in accordance with at least the first data. The first signals can take various forms depending upon the particulars of the implementation. For example, the first signals can be amplified analog signals (e.g., after amplification at an AFE that receives analog signals from PMFE(s)) or digital signals (e.g., after analog-to-digital conversion and/or other digital signal processing). For example, the first data obtained by the MCU 30 can indicate a finger press, followed by a hold (press & hold). For example, the first data can indicate a finger press, followed by release (press & release). In some cases, the MCU 30 can perform additional data processing on the first signals to obtain the first data, e.g., compare the first signals to a trigger threshold to determine whether the cover member has been touched by a finger. If there is also a second transducer, the MCU 30 can also be configured to obtain second data from the second signals and to determine a user input in accordance with at least the first data, the second data, and the operational state of the solid-state switch.

In some implementations, the microcontroller (MCU) 30 is configured to obtain first data from the first signals and is configured to determine a user input in accordance with at least the first data and an operational state of the solid-state switch. Some examples of operational states of the solid-state switch are: Sleeping (e.g., solid-state switch is in a stand-by mode to save power), Active (e.g., solid-state switch is ready to communicate via digital bus 72 with a master controller 70), and Off-Line (e.g., there is no external device, such as a master controller 70, connected to the digital bus 72). In some implementations, a user input that is determined when a first data is obtained in a first operational state differs from a user input that is determined when the same first data is received in a second operational state different from the first operational state. For example, if a first data of "press & release" is obtained when the solid-state switch is in a Sleeping operational state, the following user input may be determined: initialize the solid-state switch (transition the solid-state switch from the Sleeping state to the Active state). For example, if a first data of "press & release" is obtained when the solid-state switch is in an Active operational state, the following user input may be determined: change the state of the external system from a first state to a second state, e.g., turn ON the external system.

In some implementations of the solid-state switch, MCU 30 is couplable by a digital bus 72 to a master controller 70 of the external system 12. In the example shown in FIG. 1, the MCU 30 has been coupled by a digital bus 72 to a master controller 70 of the external system 12. Digital buses that can be used as the digital bus 72 include: I²C bus, LIN bus, CAN bus, SPI bus, and UART bus. In some implementations, MCU 30 is configured to transmit at least one of the user inputs to the master controller 70 and to receive commands from the master controller 70.

Commands transmitted from the master controller 70 to the microcontroller 30 can include commands that determine the switching behavior of the switching circuit 54. For example, in cases in which the user feedback device includes a visible light-emitting element and the feedback to the user includes a pattern of visible light, the commands from the master controller 70 may include commands that determine the pattern of visible light. For example, such commands may determine the switching behavior of the switching circuit 54 such that the electrical power delivered to the visible light-emitting element, via the switching circuit 54, is modulated by pulse-width modulation. In some cases, the MCU 30 can control or program the switching behavior.

In some implementations, the switching behavior of the switching circuit can be determined in accordance with either one or both of the following: (a) commands from the master controller to the microcontroller, and (b) user inputs as determined by the microcontroller. In some cases, the switching behavior can correspond to (a) commands from the master controller to the microcontroller. In some cases, the switching behavior can correspond to (b) user inputs as determined by the microcontroller. In some cases, the switching behavior can sequentially represent (i.e., one followed by another) (a) commands from the master controller to the microcontroller and (b) user inputs as determined by the microcontroller.

Additionally, commands transmitted from the master controller 70 to the microcontroller 30 can include commands that determine one or more aspects of the operation of the solid-state transducers 22, 24. For example, the commands might determine a sensitivity (e.g., degree of amplification of an analog signal) of the first solid-state transducer 22 and/or the second solid-state transducer 24. For example, the commands might determine a trigger threshold (e.g., threshold signal level above or below which the measured signal indicates a finger press) of the first solid-state transducer 22 and/or the second solid-state transducer 24.

Figure 2:
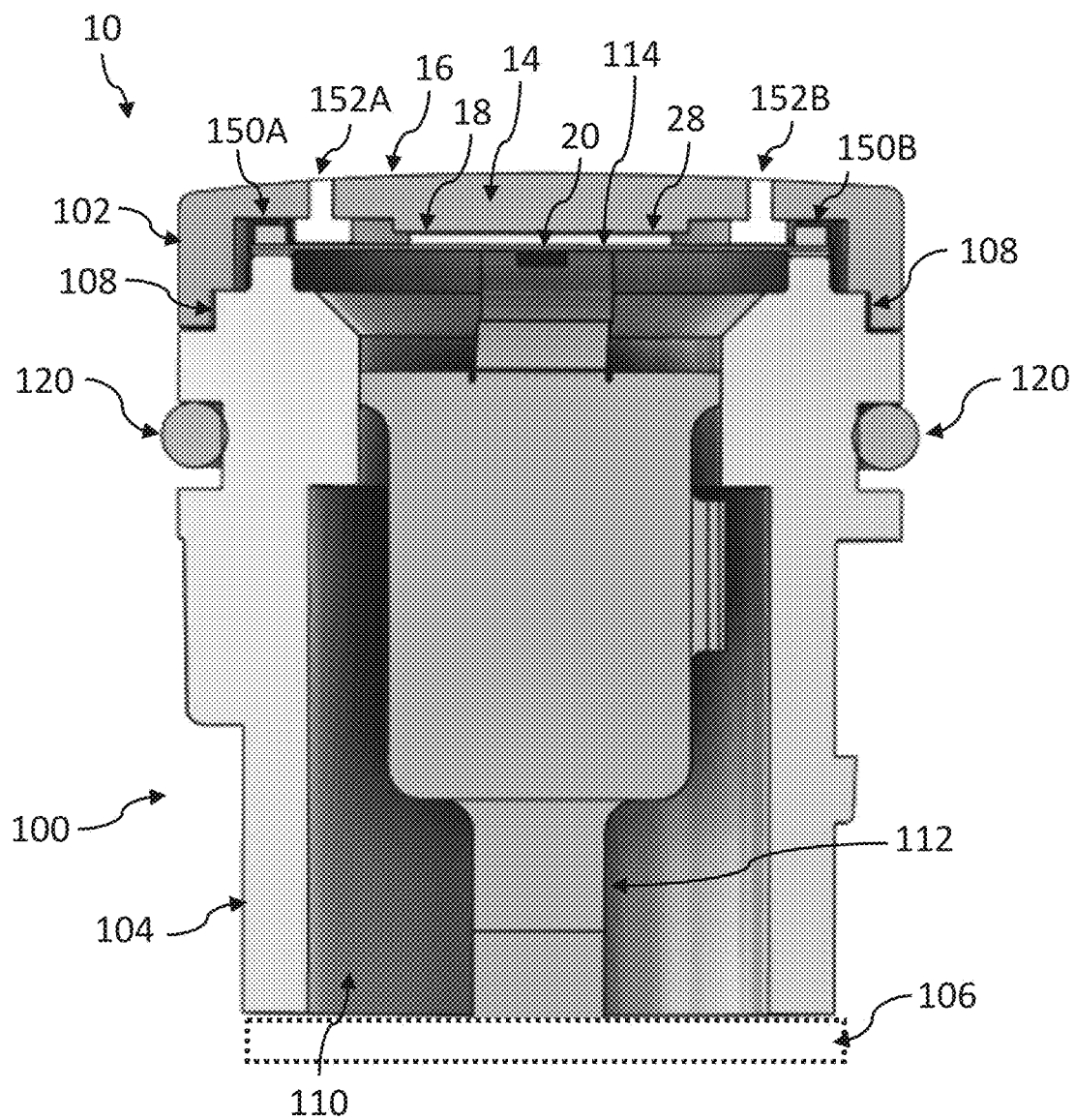
FIG. 2 partial cut-away elevational view of a solid-state switch.

FIG. 2 is a partial cut-away elevational view of one implementation of solid-state switch 10. A housing 100 of the solid-state switch 10 includes a top component 102 and a tubular component 104. The housing 100 additionally includes a bottom portion 106 that has been cut away for ease of viewing in this FIG. 2. In some implementations, the housing 100 is a sealed housing that is sealed against moisture/and or dust. For example, an interface 108 between the top component 102 and the tubular component 104 can be sealed by ultrasonic welding.

The top component 102 includes a cover member 14. FIG. 2 also shows the outer surface 16 and the inner surface 18 of the cover member 14. A flexible circuit substrate (e.g., a flexible printed circuit or FPC) 112 is contained in the interior space 110 of the housing and extends between the top component 102 and the bottom portion 106. IC 20 is mounted to a portion 114 of the flexible circuit substrate 112 near the top component 102. In the example shown, the IC 20 includes the solid-state transducers (22, 24) and MCU 30. The switching circuit 54 is mounted to the flexible circuit substrate 112 at a location that is not explicitly shown. For example, wiring connections to the power supply 60 and the master controller 70 can be formed to penetrate through the bottom portion 106. These wiring connections can include wiring connection 62 between the IC 20 and the power supply 60, wiring connection 58 between the IC 20 and the power supply 60, and digital bus 72 between the IC 20 and the external system 12. FIG. 2 shows a gasket 120 surrounding the tubular component 104. This gasket 120 can be used to form a compression seal between the solid-state switch 10 and an opening in a larger housing. For example, at least some portions of the external system can be contained in the larger housing.

The flexible circuit substrate portion 114 is adhered to the inner surface 18 of the cover member 14 via an adhesive layer 28. The adhesive layer 28 is located on a top surface of the flexible circuit substrate portion 114 and the IC 20 is mounted to a bottom surface of the flexible circuit substrate portion 114 opposite its top surface. If a finger presses against the cover member 14, the resulting perturbation (e.g., mechanical deformation) is transmitted via the adhesive layer 28 and the flexible circuit substrate portion 114 to the solid-state transducers (22, 24) in the IC 20. Accordingly, the solid-state transducers (22, 24) are mechanically coupled to the cover member 14.

In the implementation of the solid-state switch shown in FIG. 2, the user feedback device 50 includes a first LED 150A (e.g., a red LED) and a second LED 150B (e.g., a blue LED). The LEDs 150A, 150B are mounted at the left and right edges, respectively, of the flexible circuit substrate portion 114. In the examples shown, the LEDs 150A, 150B emit light sideways (rightward and leftward, respectively) towards the respective light pipe elements 152A, 152B. The light pipe elements 152A, 152B guide the respective light sideways and upwards to the outside of the cover member. Accordingly, a user of the solid-state switch can see a pattern of visible light constituting feedback to the user.

In the implementation of the solid-state switch shown in FIG. 2, the solid-state transducers (in IC 20), the MCU (in IC 20), the switching circuit 54, and the user feedback device (LEDs 150A, 150B) are contained inside the sealed housing 100. In other implementations, it may be possible to use a housing that is not sealed against moisture and/or dust. In other implementations, it may be possible to position the MCU, the switching circuit, and/or the user feedback device outside of the housing.

Figure 3:
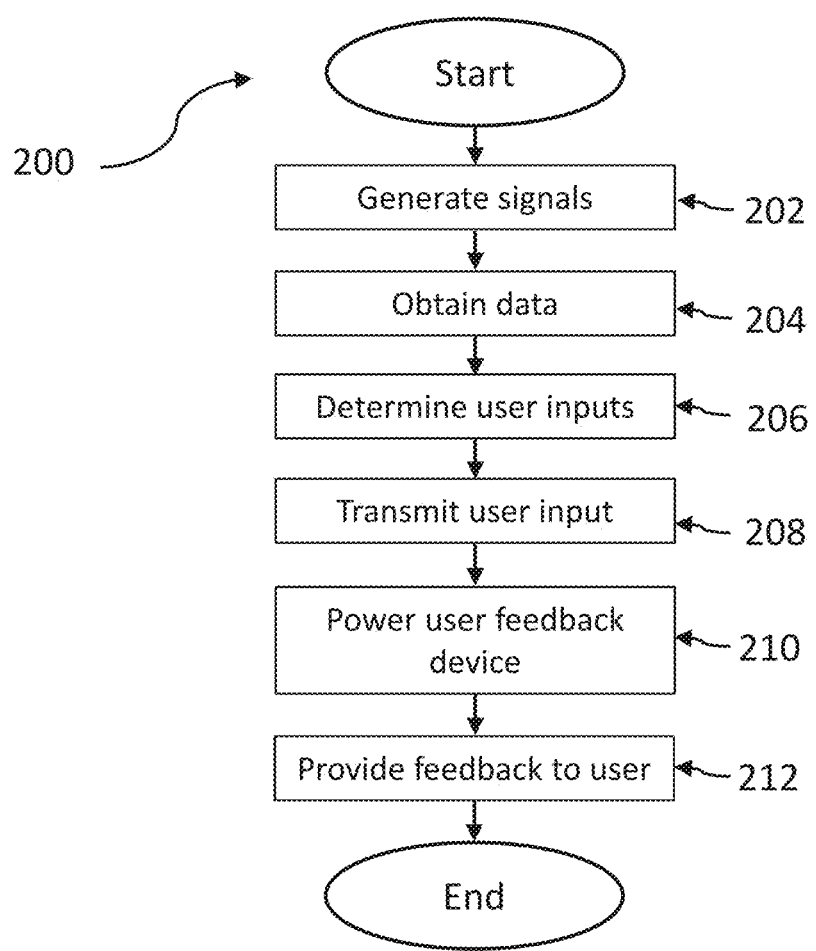
FIG. 3 show a flow diagram of a method of switching an external system using a solid-state switch.

FIG. 3 is a flow diagram of a method 200 of switching an external system 12 using a solid-state switch 10. The method 200 includes steps 202, 204, 206, 208, 210, and 212. The solid-state switch 10 includes a cover member 14, at least one solid-state transducer (at least a "first solid-state transducer," 22), a microcontroller 30, a user feedback device 50, and a switching circuit 54. Step 202 includes generating, by each solid-state transducer, respective signals in response to a perturbation at a cover member. The solid-state switch 10 can include one, two, or more solid-state transducers. In some implementations, the solid-state switch 10 includes one solid-state transducer (first solid-state transducer, 22) mechanically coupled to the cover member 14. In some implementations, the solid-state switch 10 include a first solid-state transducer and a second transducer that is not solid-state. Step 202 can include generating, by the first solid-state transducer 22, first signals in response to a perturbation at a cover member 14. In some implementations, the solid-state switch 10 includes two transducers (second transducer, 24 in addition to the first solid-state transducer, 22), with at least the first solid-state transducer being mechanically coupled to the cover member 14. Step 202 can additionally include generating, by the second transducer 24, second signals in response to the perturbation at a cover member 14. In some implementations, the solid-state switch 10 can include two or more solid-state transducers mechanically coupled to the cover member. Step 202 can include generating, by each respective solid-state transducer, respective signals in response to the perturbation at the cover member 14. In some implementations, the solid-state switch 10 can include a non-solid-state transducer, a (solid-state or non-solid state) transducer that is not included in the transducer IC 20, and/or a (solid-state or non-solid-state) transducer that is not mechanically coupled to the cover member 14. Accordingly, step 202 can include generating, by each transducer (whether solid-state or not and whether mechanically coupled to the cover member or not), a respective signal. In some cases, the respective signals can be in response to a perturbation at the cover member. In some cases, the respective signals can represent a measurement of a measurable characteristic, such as temperature, capacitance, strain, and inductance.

Step 204 includes obtaining, by the microcontroller 30, data from the respective signals. Step 204 can include receiving, by the microcontroller 30, the first signals from the first solid-state transducer 22, and carrying out any additional data processing to obtain the first data from the first signals. In implementations in which the solid-state switch 10 includes the second transducer 24 and the second transducer 24 generates second signals, step 204 can additionally include obtaining, by the microcontroller 30, second data from the second signals. In implementations in which there are signals from additional transducers, step 204 can additionally include obtaining, by the microcontroller 30, data from the respective signals.

Step 206 includes determining, by the microcontroller 30, user inputs in accordance with the respective data and an operational state of the solid-state switch 10. Step 206 can include determining, by the microcontroller 30, user inputs in accordance with at least the first data and an operational state of the solid-state switch 10. In implementations in which the solid-state switch 10 includes a second transducer 24, step 206 can include determining, by the microcontroller, the user inputs in accordance with at least the first data, the second data, and the operational state of the solid-state switch 10.

Step 208 includes transmitting, by the microcontroller 30, at least one of the user inputs via a digital bus 72 to a master controller 70 of the external system 12. In some implementations, one or more of the user inputs can be transmitted to the master controller 70. In some implementations, all of the user inputs can be transmitted to the master controller 70.

Step 210 includes powering, by a power supply 60, the user feedback device 50 via the switching circuit 54. Step 212 includes providing, by the user feedback device 50, feedback to a user of the solid-state switch 10 in accordance with the switching behavior of the switching circuit 54. The switching behavior is determined in in accordance with either one or both of the following: (a) the commands from the master controller 70 to the microcontroller 30, and (b) the user inputs as determined by the microcontroller 30.

Figure 4:
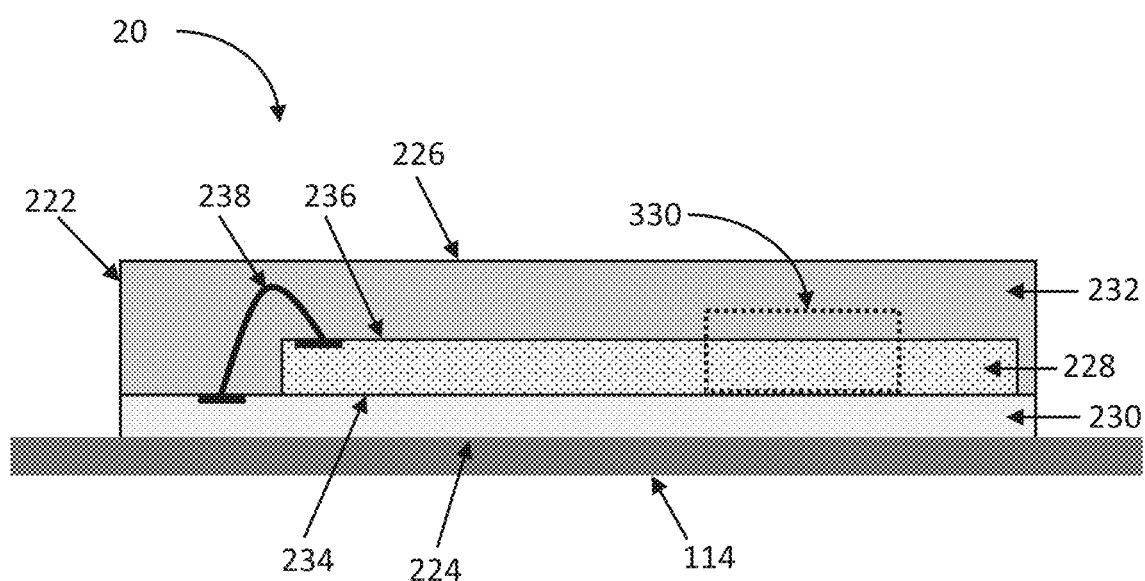
FIG. 4 is a cross-sectional view of a transducer IC.

The transducer IC 20 is shown in greater detail in FIG. 4. FIG. 4 is a cross-sectional view of a transducer IC 20. Transducer IC 20 is shown encased in a package 222, with a top surface 226 and an electrical interconnection surface (bottom surface) 224. In the example shown, the transducer IC 20 is mounted to a circuit substrate (e.g., flexible circuit substrate portion 114 as shown in FIG. 2) via the electrical interconnection surface 224. In the example shown in FIG. 2, the electrical interconnection surface can also function as a mechanical coupling surface. The transducer IC 20 includes a package substrate 230, semiconductor die (semiconductor chip) 228 mounted to the package substrate 230, and an encapsulating adhesive 232, such as an epoxy adhesive. In the example shown in FIG. 4, after the semiconductor die 228 is mounted to the package substrate 230, wire bond connections 238 are formed between the die 228 and the package substrate 230. Then the entire assembly including the die 228 and the package substrate 230 is molded (encapsulated) in an epoxy adhesive 232. In some implementations, it is preferable that the transducer IC have lateral dimensions no greater than 10 mm by 10 mm. In the example shown, the wire bond connection 238 is formed between the top surface 236 of the semiconductor die 228 and the package substrate 230. Alternatively, electrical interconnections can be formed between the bottom surface 234 of the semiconductor die 228 and the package substrate 230. The semiconductor die 228 consists of an application-specific integrated circuit (ASIC) portion and a micro-electromechanical systems (MEMS) portion. A selected portion 330 of the semiconductor die 228 is shown in cross-section in FIG. 5.

Figure 5:
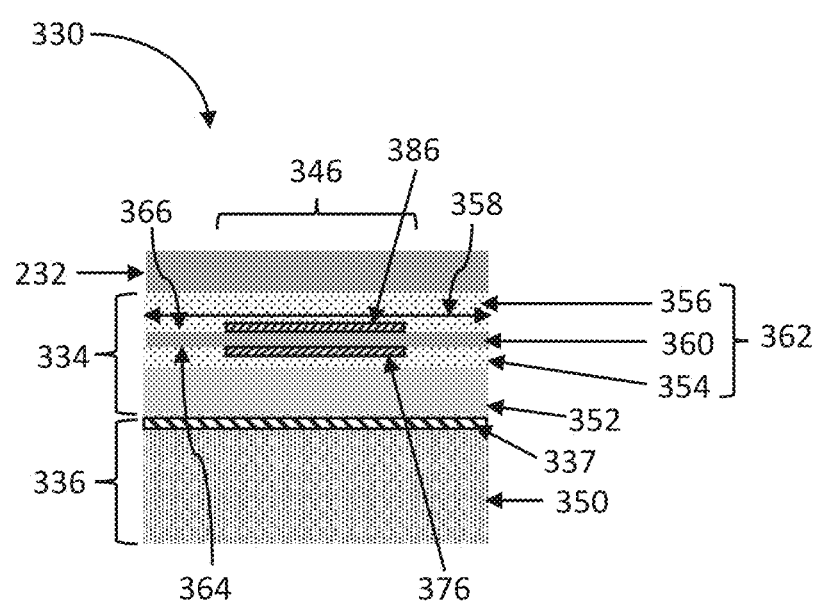
FIG. 5 is a schematic cross-sectional view of a certain portion of the transducer IC of FIG. 4.

FIG. 5 is a schematic cross-sectional view of a portion 330 of the transducer IC 20 of FIG. 4. In the example shown in FIG. 5, the solid-state transducer includes a PMFE 346. The semiconductor die 228 includes a MEMS portion 334 and an ASIC portion 336 underneath the PMFE 346. Also shown is an encapsulating adhesive 232 that is above the PMFE 346. The ASIC portion 336 consists of a semiconductor substrate 350 and signal processor 337 thereon or therein. Typically, the semiconductor substrate is a silicon substrate, but other semiconductor substrates such as silicon-on-insulator (SOI) substrates can also be used.

In the example shown in FIG. 5, the MEMS portion 334 includes a PMFE 346. The MEMS portion 334 includes a thin-film piezoelectric stack 362 overlying the semiconductor substrate 350. The thin-film piezoelectric stack 362 includes a piezoelectric layer 360, which is a layer exhibiting the piezoelectric effect. Suitable materials for the piezoelectric layer 360 are aluminum nitride, scandium-doped aluminum nitride, polyvinylidene fluoride (PVDF), lead zirconate titanate (PZT), $K_xNa_{1-x}NbO_3$ (KNN), quartz, zinc oxide, lithium niobate, and $Bi_{0.5}Na_{0.5}TiO_3$ (BNT), for example. For example, the piezoelectric layer is a layer of aluminum nitride having a thickness of approximately 1 μm. The piezoelectric layer 360 has a top major surface 366 and a bottom major surface 364 opposite the top major surface 366. In the example shown, the thin-film piezoelectric stack 362 additionally includes a top mechanical layer 356, attached to or adjacent to (coupled to) top major surface 366, and a bottom mechanical layer 354, attached to or adjacent to (coupled to) bottom major surface 364. In the example shown, the thickness of the top mechanical layer 356 is greater than the thickness of the bottom mechanical layer 354. In other examples, the thickness of the top mechanical layer 356 can be smaller than the thickness of the bottom mechanical layer 354. Suitable materials for the mechanical layer(s) are silicon, silicon oxide, silicon nitride, and aluminum nitride, for example. Suitable materials for the mechanical layer(s) can also be a material that is included in the piezoelectric layer 360, which in this case is aluminum nitride. In the example shown, the top mechanical layer and the bottom mechanical layer contain the same material. In other examples, the top mechanical layer and the bottom mechanical layer are of different materials. In other examples, the top mechanical layer or the bottom mechanical layer can be omitted. The mechanical layer(s) adjust the mechanical properties of the thin-film piezoelectric stack 362. When coupled to the cover member, the transducer IC 20 is preferably oriented such that the piezoelectric layer 360 faces toward the cover member 14. For example, the transducer IC 20 is oriented such that the piezoelectric layer 360 and the cover member 14 are approximately parallel.

For ease of discussion, only one PMFEs is shown in FIG. 5. However, a transducer IC 20 may contain multiple PMFEs. The PMFEs are located at respective lateral positions along the thin-film piezoelectric stack 362. An insulating support layer 352 supports the thin-film piezoelectric stack. Suitable materials for the support layer 352 are silicon, silicon nitride, and silicon oxide, for example. Suitable materials for the support layer 352 can also be a material that is included in the piezoelectric layer 360, which in this case is aluminum nitride.

In the example shown in FIG. 5, each PMFE 346 includes a respective portion of the thin-film piezoelectric stack 362. Each PMFE 346 includes a first PMFE electrode 376 positioned on a first side (bottom surface) 364 of the piezoelectric layer 360 and a second PMFE electrode 386 positioned on a second side (top surface) 366 opposite the first side. The first PMFE electrode 376 and the second PMFE electrode 386 are positioned on opposite sides of the piezoelectric layer 360. In each PMFE 346, the first PMFE electrode 376, the second PMFE electrode 386, and the portion of the piezoelectric layer 360 between them constitute a piezoelectric capacitor. The PMFEs are coupled to the signal processor 337 of the ASIC portion 336.

In operation, PMFE 346 is configured to output voltage signals between the PMFE electrodes (376, 386) in accordance with a time-varying strain at the respective portion of the piezoelectric layer between the PMFE electrodes (376, 386) resulting from a low-frequency mechanical deformation. PMFEs can measure low-frequency deformation corresponding to a repetitive finger press (e.g., up to about 10 Hz or perhaps up to about 100 Hz) as well as mechanical vibration at higher frequencies of up to about 10 kHz and up to about 20 kHz. Therefore, in the context of PMFEs, low-frequency mechanical deformation can mean mechanical deformation of up to about 20 kHz. The low-frequency mechanical deformation can be caused by a finger pressing against or tapping at outer surface of the cover member 14, to which the transducer IC 20 is directly or indirectly attached (mechanically coupled). The PMFE 346 is coupled to the signal processor 337. The signal processor is configured to read at least some of the PMFE voltage signals. By amplifying and processing the voltage signals from the PMFE at the signal processor, the strain that results from the mechanical deformation of the piezoelectric layer can be measured.

Typically, the low-frequency deformation is induced by perturbation (e.g., finger press) which is not repetitive or is repetitive having a repetition rate of 100 Hz or less, or 10 Hz or less. These repetition rates correspond to the repetition rates of a repetitive touch excitation, e.g., a finger repeatedly pressing against or tapping at a cover member. Illustrative force data measured during a repetitive touch event (finger touching and pressing the cover member repeatedly) is shown in FIGS. 7 and 8.

Figure 6:
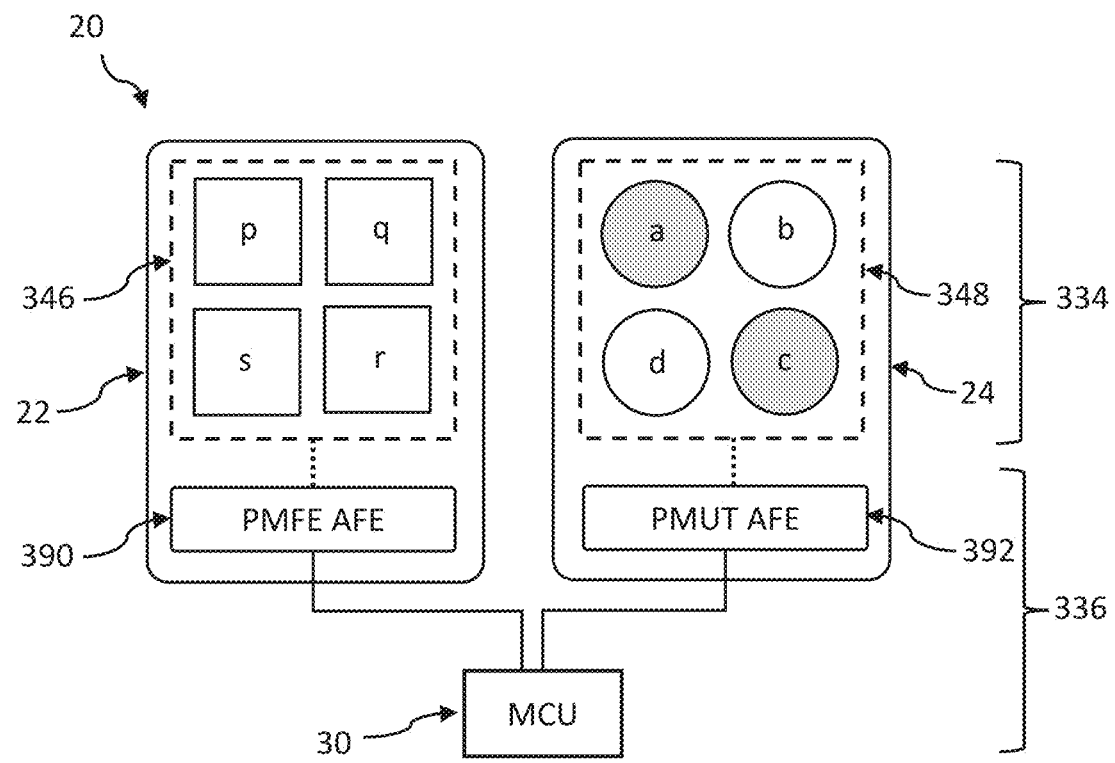
FIG. 6 is an electronics block diagram of a transducer IC.

FIG. 6 is an electronics block diagram of one implementation of transducer IC 20, including a MEMS portion 334 and ASIC portion 336. In the example shown, transducer IC 20 includes solid-state transducers 22, 24. The first solid-state transducer 22 includes PMFEs 346 (four PMFEs are shown, labeled p, q, r, and s). The second solid-state transducer 24 includes PMUTs 348 (four PMUTs are shown, labeled a, b, c, and d). For example, some of the PMUTs can be configured to be ultrasound transmitters (e.g., PMUTs labeled a and c) and some of the PMUTs can be configured to be ultrasound receivers (e.g., PMUTs labeled b and d). The PMUT transmitters would transmit ultrasound signals toward the cover member 14. Some of the ultrasound signals would be reflected at the cover member. The PMUT receivers would receive the ultrasound signals coming back from the cover member 14. For example, at least some of the ultrasound signal can be absorbed by a finger touching and/or pressing the cover member, thereby causing a change in the ultrasound signal coming back to the PMUTs from the cover member.

In the example shown in FIG. 6, the PMFEs 346 are connected to the PMFE analog front-end portion 390 and the PMUTs 348 are connected to the PMUT AFE portion 392. Each AFE portion 390, 392 includes circuits for amplifying, conditioning, and digitizing (e.g., amplifier, analog-to-digital converter (ADC)) the electrical signals from the PMFEs 346 and the PMUTs 348, respectively. In addition, the PMUT AFE can include driver circuitry for driving the PMUT transmitters. The MEMS portion 334 includes the PMFEs 346 and the PMUTs 348. In some implementations, the PMFEs 346 and PMUTs 348 can be formed at respective lateral positions along a piezoelectric stack 362. The ASIC portion 336 (the processor portion 337) includes the PMFE AFE 390, the PMUT AFE 392, and MCU 30.

Figure 7:
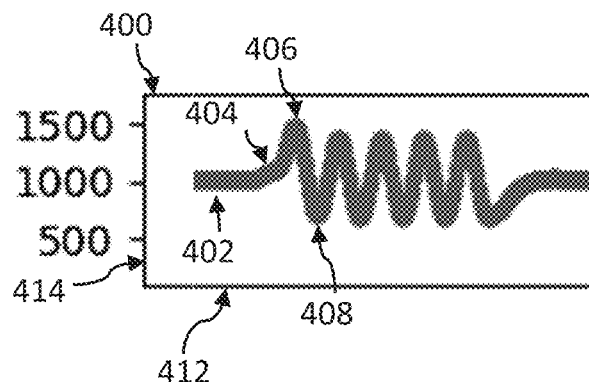
FIGS. 7 and 8 are graphical plots of strain data obtained from a piezoelectric micromechanical force-measuring elements (PMFEs) of a transducer IC in response to a perturbation at the cover member.
Figure 8:
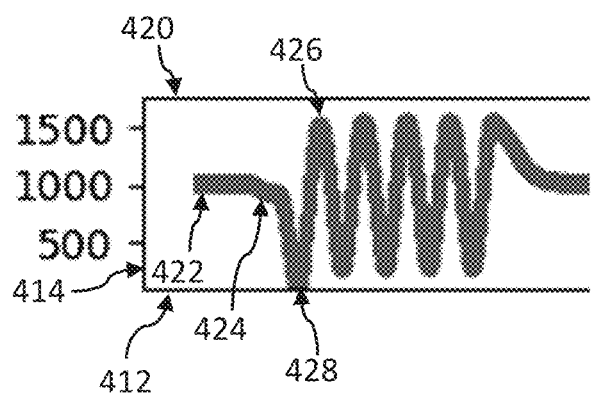

FIGS. 7 and 8 show some examples of PMFE data. FIG. 7 is graphical plot 400 of PMFE signals (PMFE data) obtained from a solid-state transducer (e.g., first solid-state transducer 22) in response to a time-varying applied force imparted at a force-imparting point (e.g., a first point on cover member 14). For example, these PMFE signals correspond to PMFE voltage signals, after amplification, conditioning, and digitization (e.g., an output from PMFE AFE 390). The time-varying applied force consists of a finger repetitively pressing at the first point of the cover member 14 five times. Plot 400 has a horizontal axis 412 which shows time t and a vertical axis 414 which shows force (PMFE data), expressed in LSB. For example, a time duration of plot 400 is 10 seconds. Before the application of the time-varying applied force, the PMFEs are in a quiescent state (plot section 402). For example, the PMFE might be in a quiescent state if there is no deformation of the cover member. As the time-varying applied force begins, the PMFE data show a positive slope (plot section 404) and then reaches a maximum 406, corresponding to strain of a first polarity at the PMFEs. For example, this corresponds to the PMFEs under tension. As the pressure at the force-imparting point is released, the PMFE data decreases from a maximum 406 to a minimum 408. Local maxima are reached five times, corresponding to repetitively pressing at the force-imparting point five times. A characteristic amplitude of the PMFE data can be defined to be a difference between a local maximum 406 and a local minimum 408. Alternatively, a characteristic amplitude of the PMFE data can be defined to be a difference between a global maximum and a global minimum, within a predetermined time window such as shown in FIG. 7. The characteristic amplitude of the PMFE data can also be referred to as a magnitude of the PMFE voltage signals. When the characteristic amplitude exceeds a trigger threshold, one can determine that a finger press at the cover member has occurred.

FIG. 8 is graphical plot 420 of PMFE signals (PMFE data) obtained from a solid-state transducer (e.g., first solid-state transducer 22) in response to a time-varying applied force imparted at another force-imparting point (e.g., a second point on cover member 14). For example, this force-imparting point is different from the force-imparting point of FIG. 7. This force-imparting point can be laterally displaced from and/or remote from the first solid-state transducer. For example, a time duration of plot 420 is 10 seconds. Before the application of the time-varying applied force, the PMFEs are in a quiescent state (plot section 422). As the time-varying applied force begins, the PMFE data show a negative slope (plot section 424) and then reaches a local minimum 428, corresponding to strain of a second polarity at the PMFEs. This corresponds to the PMFEs under compression. As the pressure at the force-imparting point is released, the PMFE data increases from a local minimum 428 to a local maximum 426. Local minima are reached five times, corresponding repetitively pressing against the force-imparting point five times. A characteristic amplitude of the PMFE data can be defined to be a difference between the local maximum 426 and the local minimum 428. Alternatively, a characteristic amplitude of the PMFE can be defined to be a difference between a global maximum and a global minimum, within a predetermined time window such as shown in FIG. 8. In some implementations, if the characteristic amplitude exceeds the trigger threshold but the polarity of the PMFE waveform is different from that expected for a finger press at a force-imparting point on the cover member close to the solid-state transducer, one can determine that a finger press at the expected location (e.g., a point sufficiently close to the solid-state transducer) has not occurred.

Figure 9:
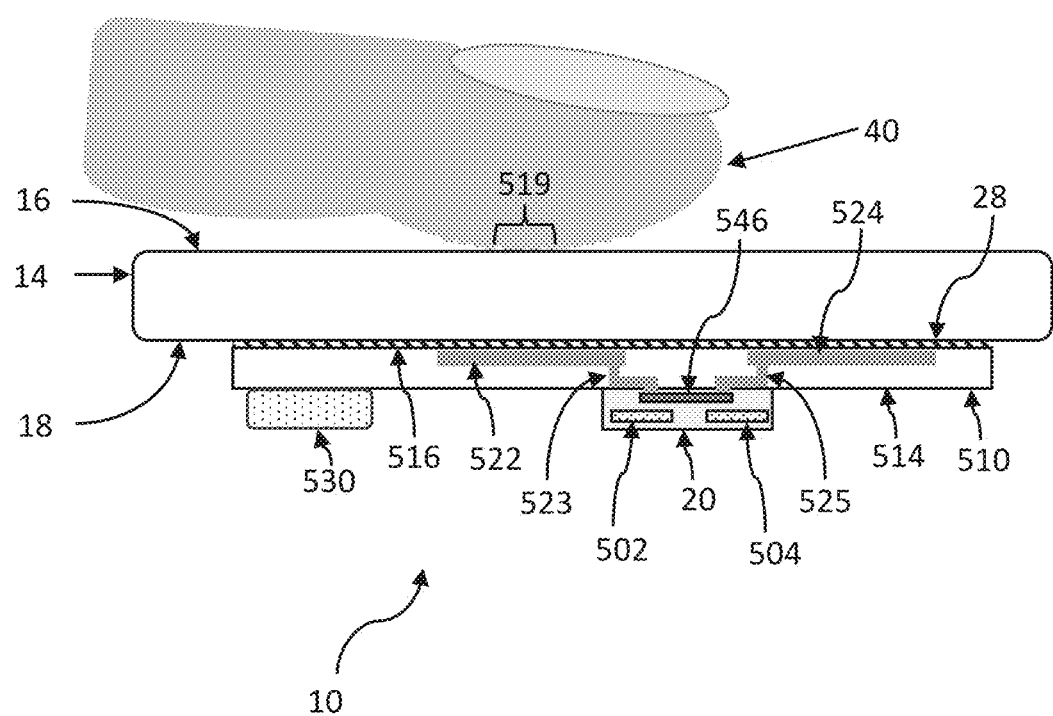
FIG. 9 is a schematic view of an illustrative sub-system, illustrating the use of capacitance-measuring sensor electrodes.

FIG. 9 is a schematic view of a portion of a solid-state switch 10, showing one implementation of capacitance-measuring sensor electrodes. The solid-state switch 10 includes a transducer IC 20. In the example shown, the transducer IC 20 includes piezoelectric micromechanical force-measuring elements (PMFEs) 502, 504. For example, each PMFE 502, 504 can be configured to output voltage signals in accordance with a time-varying strain at each respective PMFE. The solid-state switch 10 also includes a cover member 14 and an elastic circuit board substrate 510 interposed between the transducer IC 20 and the cover member 14. The elastic circuit board substrate 510 is mechanically coupled to the cover member 14 and to the transducer IC 20. The transducer IC 20 is mounted to and electrically connected to the elastic circuit board substrate 510. In the example shown, the transducer IC 20 is mounted to and electrically connected to the elastic circuit board substrate 510 at its first surface (bottom surface) 514. For example, there are sensor electrodes 522, 524 on or in in the elastic circuit board substrate 510. An electrical wiring 523 electrically connects sensor electrode 522 to a circuit (signal processor 546) in the transducer IC 20. An electrical wiring 525 electrically connects sensor electrode 524 to the signal processor 546. The transducer IC 20 can be attached to the elastic circuit board substrate by solder-bonding, for example. Additionally, other integrated circuits (IC), electrical components, and electromechanical components (e.g., a motor) can be mounted to the elastic circuit board substrate 510 at its bottom surface 514. These other components are collectively labeled as 530 in FIG. 1. In the implementation shown in FIG. 9, there is first solid-state transducer comprising the PMFEs 502, 504 and a second solid-state transducer comprising the sensor electrodes 522, 524.

The cover member 14 has an exposed outer surface 16 and an inner surface 18 opposite the outer surface. The cover member 14 should be robust but should be sufficiently deformable such that a deformation of the cover member is transmitted to the PMFEs (502, 504) in the transducer IC 20.

FIG. 9 shows an example of a contact point 519, which is an area where the finger 40 contacts the outer surface 16 of the cover member 14 when touching, tapping, and/or pressing. The cover member 14 can be a robust material that deforms when pressed by the finger 40. Examples of such robust materials are wood, glass, metal, plastic, leather, fabric, and ceramic. However, for solid-state switches (and more generally, user input systems) that are configured to measure self-capacitance or mutual capacitance, the cover member should be electrically non-conducting. In this case, the use of metal can be avoided. The cover member 14 could also be a composite stack of any of the foregoing materials. The elastic circuit board substrate 512 is adhered to or attached to the inner surface 18 of the cover member 14 by a layer of adhesive 28, for example. The choice of adhesive 28 is not particularly limited if the elastic circuit board substrate 510 remains attached to the cover member. The adhesive 28 could be double-sided tape, pressure sensitive adhesive (PSA), epoxy adhesive, or acrylic adhesive, for example. The adhesive 28 is applied between the inner surface 18 of the cover member 14 and the second surface (top surface) 516 of the elastic circuit board substrate 510 opposite the bottom surface 514. The cover member 14 undergoes a primary mechanical deformation in response to forces imparted at the cover member. For example, forces are imparted at the cover member if the finger 40 touches and/or presses the cover member 14 at a contact point 519 (in such a case, contact point 519 is also regarded as a force-imparting point). The elastic circuit board substrate 510 transmits a portion of the primary mechanical deformation to the transducer IC 20 resulting in a concurrent secondary mechanical deformation of the transducer IC 20. Each PMFE (502, 504) is configured to output voltage signals in accordance with a time-varying strain at the respective PMFE resulting from the secondary mechanical deformation.

Figure 10:
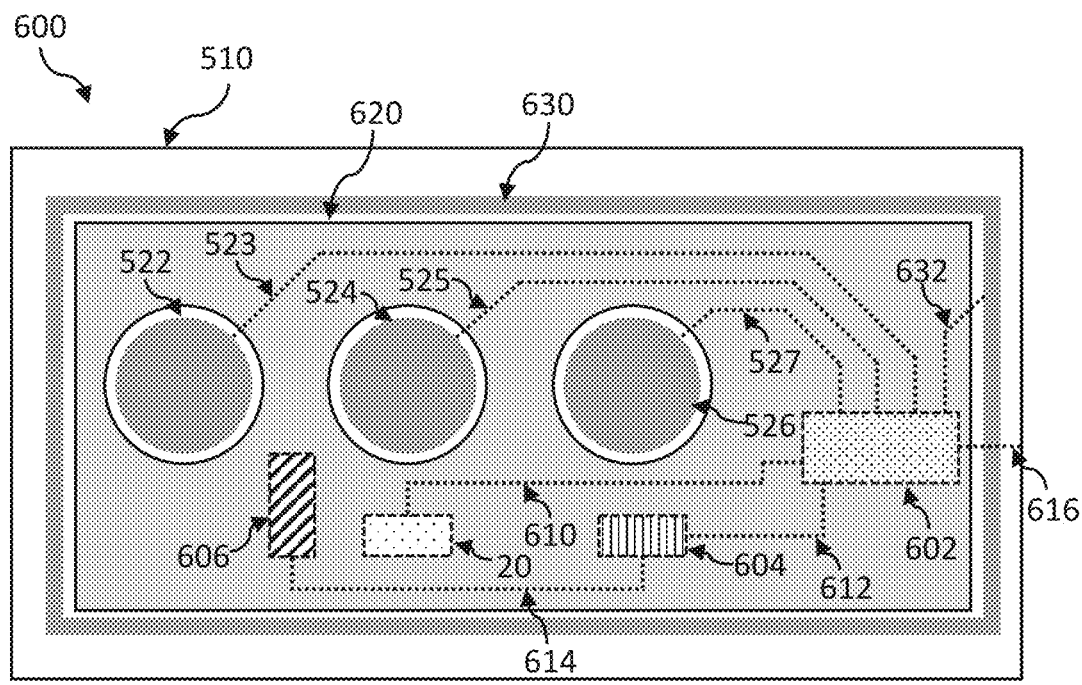
FIGS. 10 and 11 are schematic plan views of sub-systems showing the implementations of capacitance-measuring sensor electrodes on circuit board substrates.
Figure 12:
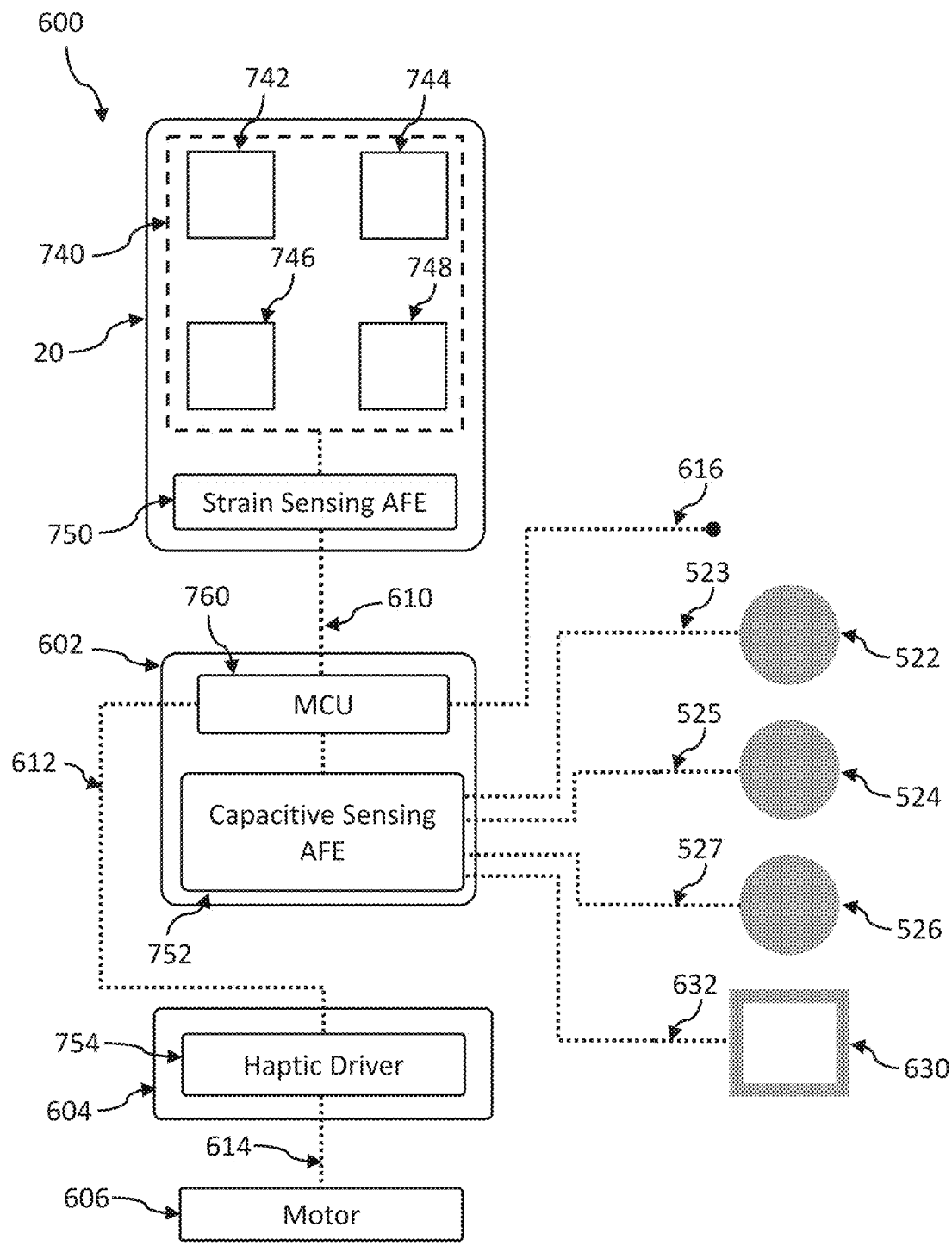
FIGS. 12 and 13 are schematic block diagrams of the sub-systems of FIGS. 10 and 11, respectively.

FIG. 10 is a plan view of a sub-system 600 (e.g., a sub-system of a solid-state switch 10) including capacitance-measuring sensor electrodes as implemented on or in an elastic circuit board substrate 510. FIG. 12 corresponds to FIG. 10 and is a schematic block diagram of sub-system 600. Sensor electrodes 522, 524, 526 are positioned on or in the elastic circuit board substrate 510. The sensor electrodes 522, 524, 526 are connected, via respective electrical wiring 523, 525, 527, to a system-on-a-chip (SoC) 602. SoC 602 includes a capacitive sensing analog front-end (AFE) circuit 752 and a microcontroller (MCU) 760. The electrical wiring 523, 525, and 527 electrically connect the respective sensor electrodes 522, 524, 526 to the capacitive-sensing AFE 752. There is also a proximity sensor electrode 630 positioned on or in the elastic circuit board substrate 510. The proximity sensor electrode 630 is connected, via electrical wiring 632, to the capacitive-sensing AFE 752 of the SoC 602. In the example shown, the proximity sensor electrode 630 encloses the sensor electrodes (522, 524, 526). For example, the proximity sensor electrode encloses an area that is greater than an area of one of the sensor electrodes by a factor of at least 2. Preferably, there is a grounded electrode 620 which separates the sensor electrodes (522, 524, 526) and the proximity sensor electrode (630) from each other. The sensor electrodes (522, 524, 526), the proximity sensor electrode (630), and the grounded electrode (620) can be included in one layer ("electrode layer") of metal in the circuit board 510. The illustrated wiring 523, 525, 527, 610, 612, 614, 632 can be included in a wiring layer, different from the electrode layer.

In the example shown, the sub-system 600 additionally includes a transducer IC 20, a haptic driver IC 604, and a haptic motor 606, mounted to the bottom surface 514 of the elastic circuit board substrate 510. The haptic driver IC 604 and haptic motor 606 correspond to other components 530 in FIG. 9. The haptic driver IC 604 includes a haptic driver circuit 754. There is an electrical wiring 614 between the haptic driver circuit 754 and the haptic motor 606. The haptic motor 606 is driven by the haptic driver circuit 754. Since the haptic motor 606 is mounted to the elastic circuit board substrate 510 and the elastic circuit board substrate 510 is mechanically coupled to the cover member 14, the haptic motor 606 is mechanically coupled to the cover member 14. The haptic motor 606 is an example of a user feedback device (50 in FIG. 1) and the haptic driver circuit 754 is an example of a switching circuit (54 in FIG. 1).

In the implementation shown in FIGS. 10 and 12, the transducer IC 20 includes a micro-electro-mechanical systems (MEMS) portion 740 and a strain-sensing AFE 750 (FIG. 12). The strain-sensing AFE 750 is included in the application-specific integrated circuit (ASIC) portion of the transducer IC 20. In the example shown, the MEMS portion 740 includes 4 piezoelectric micromechanical force-measuring elements (PMFEs) 742, 744, 746, 748. In the example shown, the strain-sensing AFE 750 is configured to read at least some of the PMFE voltage signals. Strain-sensing AFE 750 includes analog signal processing circuitry (including amplifiers) for conditioning the voltage signals from the PMFEs. There is an electrical wiring 610 between the strain-sensing AFE 750 and the MCU 760. There is an electrical wiring 612 between the MCU 760 and the haptic driver circuit 754. The strain-sensing AFE 750, the MCU 760, the capacitive-sensing AFE 752, and the haptic driver 754 can be referred to collectively as a signal processor. There can be electrical wiring 616 (e.g., bus wiring) between the MCU 760 and another component. The other component can be a microprocessor or a microcontroller located off the elastic circuit board substrate 510. For example, the other component can be a master controller 70 of an external system 12 (FIG. 1). In this case, MCU 760 and wiring 616 would correspond to MCU 30 and digital bus wiring 72 of FIG. 1, respectively.

Capacitive-sensing AFE 752 includes analog signal processing circuitry (including amplifiers) for conditioning the analog signal from the sensor electrodes (522, 524, 526) and/or the proximity sensor electrode(s) 630. Herein, the sensor electrodes and the proximity sensor electrodes may sometimes be referred to collectively as "sensor electrodes." After signal conditioning, capacitance signals from the sensor electrodes and/or the proximity sensor electrode(s) can be processed by the MCU 760. For each of the sensor electrodes, the signal processor (e.g., SoC 602) is configured to: (1) measure a capacitance between the respective sensor electrode and its surrounding environment (self-capacitance data) and/or (2) measure a capacitance between the respective sensor electrode and an adjacent one of the sensor electrodes (mutual capacitance data). Similarly, for each proximity sensor electrode, the signal processor is configured to measure a capacitance between the proximity sensor electrode and its surrounding environment (proximity self-capacitance data).

Preferably, the capacitive-sensing AFE 752 is configured such that the proximity sensor electrode 630 has greater sensitivity to capacitance changes than do the sensor electrodes 522, 524, and 526. Accordingly, the proximity sensor electrode can be used to measure capacitance changes at the proximity sensor electrode 630 caused by an object (e.g., a finger) approaching but not yet touching the cover member 14. On the other hand, the sensor electrodes can be used to measure capacitance changes at the sensor electrodes 522, 524, 526 caused by an object (e.g., a finger) touching the cover member 14. Preferably, the signal processor (e.g., SoC 602) is configured to detect proximity of an object to the cover member 14 when at least the following condition is satisfied: a magnitude of the proximity self-capacitance data exceeds a proximity self-capacitance threshold. For example, the proximity self-capacitance threshold can be predetermined (e.g., determined at the time of programming the signal processor) or algorithmically determined (e.g., determined and changed from time to time by an algorithm). Additionally, the signal processor can be configured to measure the self-capacitance data and/or the mutual capacitance data when the signal processor detects proximity of the object.

Figure 11:
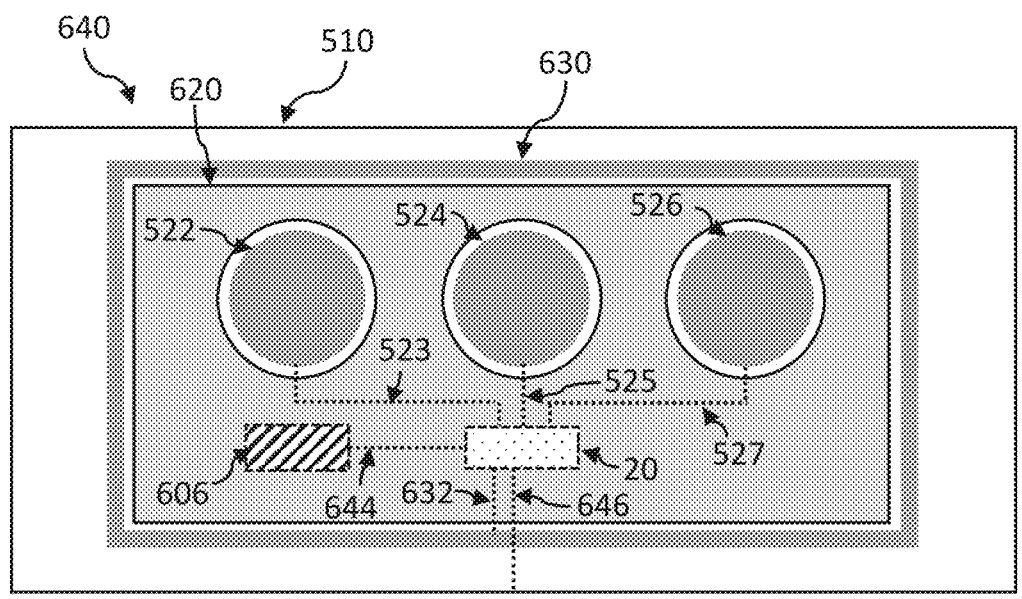
Figure 13:
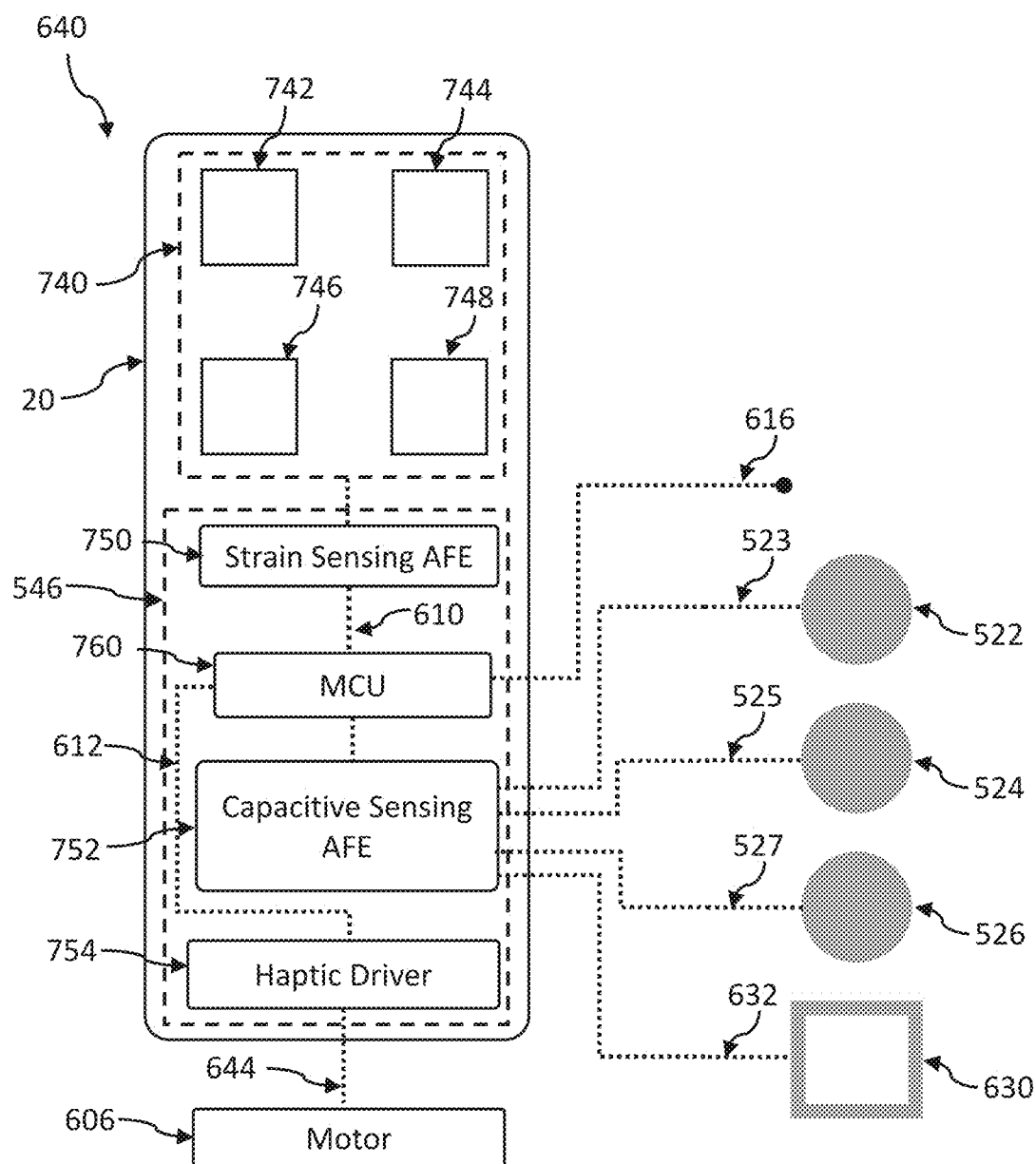

FIG. 11 is a plan view of a sub-system 640 (e.g., a sub-system of a solid-state switch 10) including capacitance-measuring sensor electrodes as implemented on or in an elastic circuit board substrate 510. FIG. 13 corresponds to FIG. 11 and is a schematic block diagram of sub-system 640. This sub-system implementation 640 differs from the sub-system implementation 600 in that the signal processor circuits are integrated into the transducer IC 20. In the example shown, the MCU 760, the capacitive-sensing AFE 752, and haptic driver circuit 754 are included in the transducer IC. The signal processor 546, including the strain-sensing AFE 750, the MCU 760, the capacitive-sensing AFE 752, and haptic driver circuit 754 are included in the transducer IC 20. Embodiments are possible in which a portion of the signal processor 546 is included in the transducer IC 20 or an entirety of the signal processor 546 is included in the transducer. It is possible for a portion or an entirety of the haptic driver 754 to be included in the transducer IC 20.

In the implementations shown in FIGS. 10, 11, 12, and 13, the first solid-state transducer includes the PMFEs (e.g., 742, 744, 746, 748) and the second transducer, which is solid-state, includes the capacitance-measuring sensor electrodes (e.g., 522, 524, 526, 630). The first solid-state transducer is mechanically coupled to the cover member and configured to generate first signals (PMFE signals) in response to a perturbation at the cover member. The second transducer is configured to generate second signals (capacitance readings from respective sensor electrodes) in response to the perturbation. The MCU obtains the first data from the first signals and the second data from the second signals. In some implementations, the second data comprise (1) capacitance between at least one of the sensor electrodes and its surrounding environment (self-capacitance data) and/or (2) capacitance between a first one of the sensor electrodes and a second one of the sensor electrodes (mutual capacitance data). In some implementations, the second data can include one or more of the following: (1) a position of user-induced perturbation at the cover member (perturbation position) in accordance with a map of the self-capacitance data; (2) a comparison of a magnitude of the self-capacitance data to a self-capacitance threshold; (3) a position of user-induced perturbation at the cover member (perturbation position) in accordance with a map of the mutual capacitance data; and (4) a comparison of a magnitude of the mutual capacitance data to a mutual capacitance threshold. These implementations are described hereinbelow.

Figure 14:
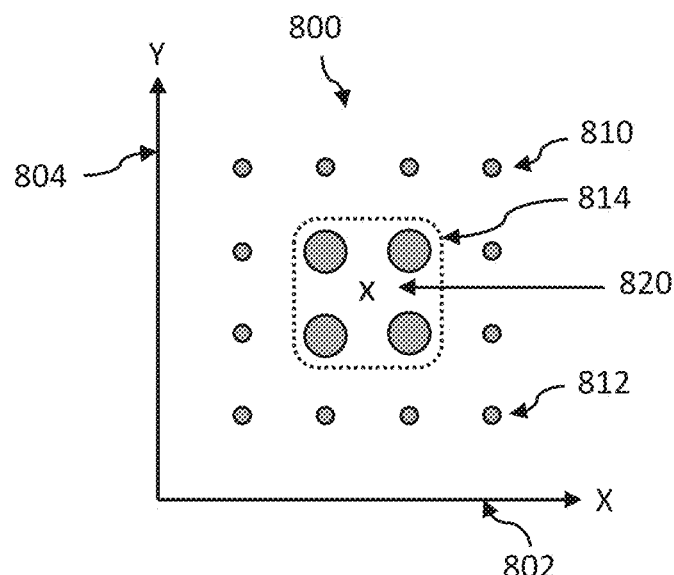
FIG. 14 is a map of capacitance data for a two-dimensional array of sensor electrodes.

FIG. 14 is a map 800 of capacitance data for a two-dimensional array of sensor electrodes. The sensor electrodes 810 (grey circles) are arranged in a two-dimensional array extending along the X-axis 802 and Y-axis 804. The map 800 can be a map of self-capacitance data of each of sensor electrodes or a map of mutual capacitance data between each of the sensor electrodes and an adjacent one of the sensor electrodes. The dimensions of the grey circles represent the magnitudes of the capacitance data. In the example shown, small capacitance values were measured at the small circles 812 and large capacitance values were measured at the large circles 814. Four adjacent sensor electrodes exhibited large capacitance values (814). The large capacitance data (self-capacitance or mutual capacitance) measured at the sensor electrodes 814 exceeded a capacitance threshold and the small capacitance data (self-capacitance or mutual capacitance) measured at the sensor electrodes 812 did not exceed a capacitance threshold. The magnitude of the capacitance data exceeding a capacitance threshold can be one of the conditions for the signal processor to detect a user-induced perturbation (e.g., finger positioned in close proximity to the contact point, finger touch, finger press & release, finger press & hold, multiple repetitions of finger press). For example, the capacitance threshold (self-capacitance or mutual capacitance) can be predetermined (e.g., determined at the time of programming the signal processor) or algorithmically determined (e.g., determined and changed from time to time by an algorithm).

Depending on geometrical factors such as the sizes of the sensor electrodes and the distances between the sensor electrodes, a typical human finger might overlap all four sensor electrodes 814 exhibiting large capacitance values, or a typical finger might contact the cover member at a point in between the sensor electrodes 814. If the map 800 is a map of self-capacitance data, the signal processor is configured to estimate a position of the user-induced perturbation at the cover member (perturbation position) in accordance with a map of the self-capacitance data. If the map 800 is a map of mutual capacitance data, the signal processor is configured to estimate a position of the user-induced perturbation at the cover member (perturbation position) in accordance with a map of the mutual capacitance data. For example, the signal processor can estimate the perturbation position to be point 820, indicated by symbol x, in between the large circles 814.

Figure 15:
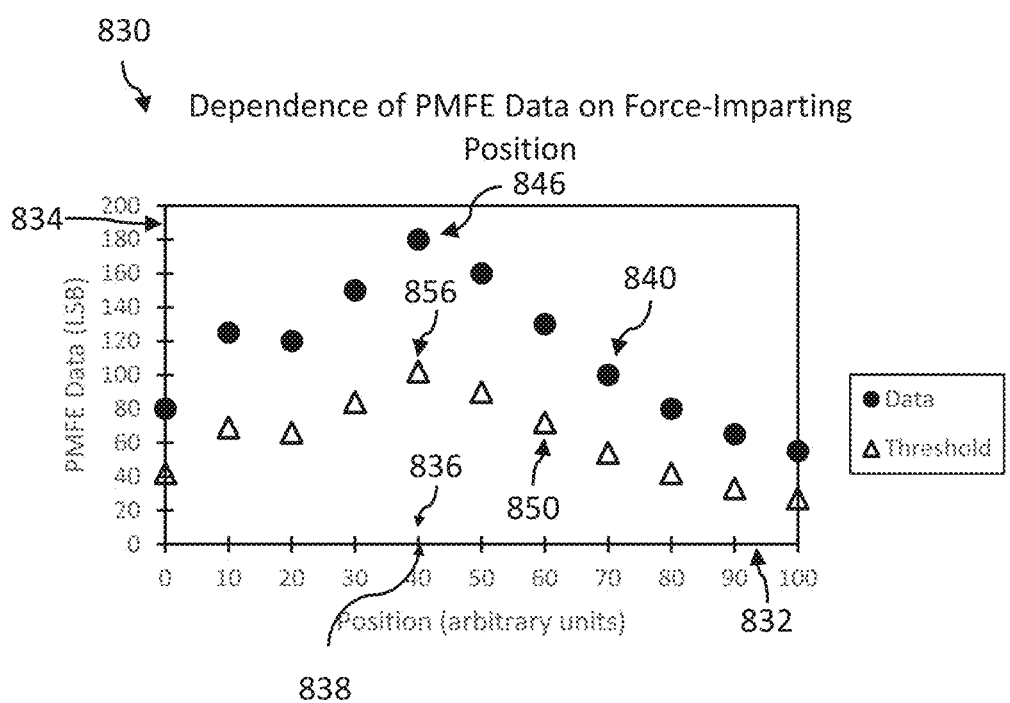
FIG. 15 is a graphical plot showing dependence of measured PMFE data on force-imparting position.

FIG. 15 is a graphical plot 830 showing dependence of PMFE data on force-imparting position (perturbation position in which a finger touches or presses the cover member). Plot 830 has an X-axis 832 showing force-imparting position (expressed in arbitrary units) and a Y-axis 834 showing PMFE data (expressed in LSB). The force-imparting position varied between 0 and 100 arbitrary units. At each force-imparting position, a standardized force is applied. The standardized force is a force corresponding to a typical press by a finger, such as 7.5 N. The PMFE from which the PMFE voltage signals were output was located at position 838, near 40 arbitrary units. The PMFE data 846 (black circles) are obtained by amplification, analog-to-digital conversion, and other signal processing of the PMFE voltage signals. The PMFE data 840 depend on the force-imparting point. The magnitude and/or the polarity of the PMFE data 840 can depend on a distance between the PMFE and the force-imparting point. The magnitude and/or the polarity of the PMFE data 840 can also depend on local mechanical properties of the cover member and the elastic circuit board substrate. Generally, the PMFE data 840 depend on the position of the force-imparting point, or the perturbation position. For example, PMFE data 846, corresponding to force-imparting point 836 (near 40 arbitrary units), has a greater magnitude than any of the other measured PMFE data 840. This force-imparting point 836 is closer than any of the other force-imparting points to the PMFE (at position 838).

Since the PMFE data under a standard imparted force varies depending on the force-imparting position, it is also possible to set a force threshold 856 (shown as white triangles) that varies in accordance with the force-imparting position. The magnitude of the PMFE voltage signals exceeding a force threshold can be one of the conditions for the signal processor to detect user-induced perturbation. For example, the force threshold can be predetermined (e.g., determined at the time of programming the signal processor) or algorithmically determined (e.g., determined and changed from time to time by an algorithm). If the self-capacitance is measured, the signal processor can be configured to detect a user-induced perturbation when at least the following conditions are satisfied: (1) a magnitude of the self-capacitance data exceeds a self-capacitance threshold and (2) a magnitude of the PMFE voltage signals exceeds a force threshold that varies in accordance with the force-imparting position. If the mutual capacitance is measured, the signal processor can be configured to detect a user-induced perturbation when at least the following conditions are satisfied: (1) a magnitude of the mutual capacitance data exceeds a mutual capacitance threshold and (2) a magnitude of the PMFE voltage signals exceeds a force threshold that varies in accordance with the force-imparting position.

Figure 16:
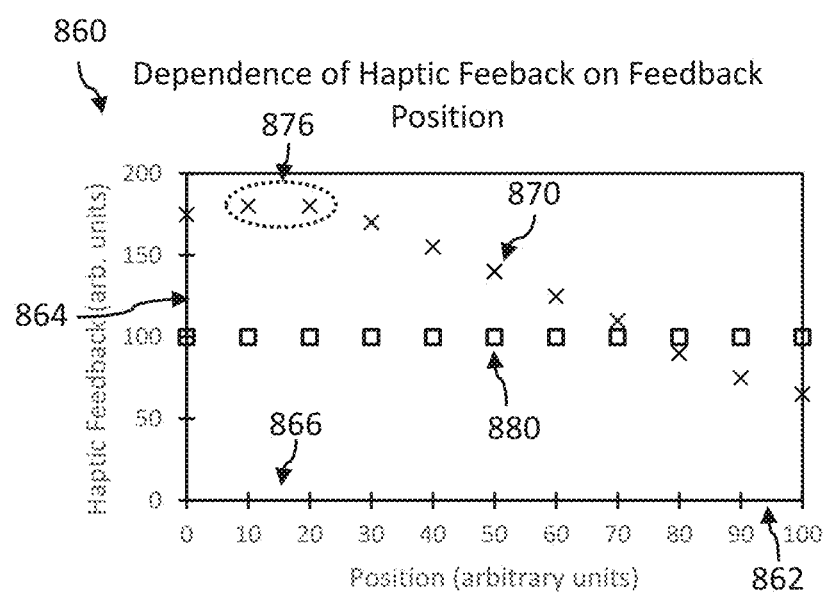
FIG. 16 is a graphic plot showing dependence of haptic feedback on feedback position (contact point).

FIG. 16 is a graphic plot 860 showing dependence of haptic feedback on haptic feedback position. Plot 860 has an X-axis 862 showing haptic feedback position (expressed in arbitrary units) and a Y-axis 864 showing a magnitude of haptic feedback (expressed in arbitrary units). The haptic feedback position is the contact point at which a finger contacts the cover member and senses the haptic feedback. The haptic feedback position varied between 0 and 100 arbitrary units. The haptic motor was located at position 866, near 15 arbitrary units. Two types of haptic feedback data are shown: position-independent haptic feedback 870 (shown as x's) and position-dependent haptic feedback 880 (shown as white squares). In the case of position-independent haptic feedback 870, the haptic driver drives the haptic motor at constant amplitudes. Since the haptic feedback position (contact point) varies and the distance between the haptic feedback position and the haptic motor position varies, the haptic feedback sensed by the finger varies. The haptic feedback is greatest at data points 876, which are closest to the haptic motor position 866. In the case of position-dependent haptic feedback 880, the haptic driver drives the haptic motor at amplitudes that vary in accordance with the contact point. In particular, the haptic driver can be configured to drive the haptic motor at varying amplitudes such that the haptic feedback is approximately constant regardless of haptic feedback position (contact point).

What is claimed is:
1. A solid-state switch for an external system, comprising:
a cover member;
a first solid-state transducer mechanically coupled to the cover member and configured to generate first signals in response to a perturbation at the cover member;
a microcontroller configured to obtain first data from the first signals and determine user inputs in accordance with at least the first data and an operational state of the solid-state switch;
a user feedback device; and
a switching circuit;
wherein:

the user feedback device is configured to be powered by a power supply via the switching circuit;

the user feedback device is configured to provide feedback to a user of the solid-state switch in accordance with a switching behavior of the switching circuit;

the microcontroller is couplable by a digital bus to a master controller of the external system; and the switching behavior of the switching circuit is determined in accordance with either one or both of the following: (a) commands from the master controller to the microcontroller, and (b) the user inputs as determined by the microcontroller.

2. The solid-state switch of claim 1, wherein the user feedback device comprises a visible light-emitting element, a haptic transducer, and/or an audible sound emitting element.

3. The solid-state switch of claim 2, wherein:
the user feedback device comprises the visible light-emitting element; and
the feedback to the user comprises a pattern of visible light.

4. The solid-state switch of claim 3, wherein:
the pattern of visible light comprises a pattern of visible light of varying intensities, a pattern of visible light of varying mixtures of colors, or a pattern of visible light of varying intensities and varying mixtures of colors.

5. The solid-state switch of claim 1, wherein:
the commands from the master controller to the microcontroller comprise commands that determine a sensitivity of the first solid-state transducer and/or a trigger threshold of the first solid-state transducer.

6. The solid-state switch of claim 1, wherein:
the solid-state switch comprises an integrated circuit device; and
the integrated circuit device comprises the first solid-state transducer and the microcontroller.

7. The solid-state switch of claim 1, wherein:
the solid-state switch comprises a sealed housing sealed against moisture and/or dust;
the sealed housing comprises the cover member; and
the first solid-state transducer is contained inside the sealed housing.

8. The solid-state switch of claim 7, wherein the microcontroller, the switching circuit, and/or the user feedback device are contained inside the sealed housing.

9. The solid-state switch of claim 7, wherein the sealed housing is sealed by ultrasonic welding.

10. The solid-state switch of claim 1, wherein the first solid-state transducer comprises a piezoelectric micromechanical force-measuring element (PMFE).

11. The solid-state switch of claim 1, wherein the digital bus is selected from: I²C bus, LIN bus, CAN bus, SPI bus, and UART bus.

12. The solid-state switch of claim 1, wherein the external system comprises a solar-power system.

13. The solid-state switch of claim 1, wherein:
the solid-state switch additionally comprises a second transducer configured to generate second signals in response to the perturbation; and
the microcontroller is configured to obtain second data from the second signals and determine the user inputs in accordance with at least the first data, the second data, and the operational state of the solid-state switch.

14. The solid-state switch of claim 13, wherein:
the first solid-state transducer comprises a piezoelectric micromechanical force-measuring element (PMFE);
the cover member is electrically non-conducting;
the solid-state switch comprises an elastic circuit board substrate mechanically coupled to the cover member;
the second transducer comprises one or more sensor electrodes positioned on or in the elastic circuit board substrate; and
the second data comprise (1) capacitance between at least one of the sensor electrodes and its surrounding environment (self-capacitance data) and/or (2) capacitance between a first one of the sensor electrodes and a second one of the sensor electrodes (mutual capacitance data).

15. The solid-state switch of claim 14, wherein the second data comprise one or more of the following:
(1) a position of the perturbation at the cover member (perturbation position) in accordance with a map of the self-capacitance data;
(2) a comparison of a magnitude of the self-capacitance data to a self-capacitance threshold;
(3) a position of the perturbation at the cover member (perturbation position) in accordance with a map of the mutual capacitance data; and
(4) a comparison of a magnitude of the mutual capacitance data to a mutual capacitance threshold.

16. A method of switching an external system using a solid-state switch, comprising:
(A1) generating, by a first solid-state transducer, first signals in response to a perturbation at a cover member, the first solid-state transducer being mechanically coupled to the cover member;
(A2) obtaining, by a microcontroller, first data from the first signals;
(A3) determining, by the microcontroller, user inputs in accordance with at least the first data and an operational state of the solid-state switch;
(A4) transmitting, by the microcontroller, at least one of the user inputs via a digital bus to a master controller of the external system;
(A5) powering, by a power supply, a user feedback device via a switching circuit; and
(A6) providing, by the user feedback device, feedback to a user of the solid-state switch in accordance with a switching behavior of the switching circuit, the switching behavior being determined in in accordance with either one or both of the following: (a) the commands from the master controller to the microcontroller, and (b) the user inputs as determined by the microcontroller;
wherein:
the solid-state switch comprises the cover member, the first solid-state transducer, the microcontroller, the user feedback device, and the switching circuit.

17. The method of claim 16, wherein the user feedback device comprises a visible light-emitting element, a haptic transducer, and/or an audible sound emitting element.

18. The method of claim 17, wherein:
the user feedback device comprises the visible light-emitting element; and
the feedback to the user comprises a pattern of visible light.

19. The method of claim 18, wherein:
the pattern of visible light comprises a pattern of visible light of varying intensities, a pattern of visible light of varying mixtures of colors, or a pattern of visible light of varying intensities and varying mixtures of colors.

20. The method of claim 16, wherein:
the commands from the master controller to the microcontroller comprise commands that determine a sensitivity of the first solid-state transducer and/or a trigger threshold of the first solid-state transducer.

21. The method of claim 16, wherein:
the solid-state switch comprises an integrated circuit device; and
the integrated circuit device comprises the first solid-state transducer and the microcontroller.

22. The method of claim 16, wherein:
the solid-state switch comprises a sealed housing sealed against moisture and/or dust;
the sealed housing comprises the cover member; and
the first solid-state transducer is contained inside the sealed housing.

23. The method of claim 22, wherein the microcontroller, the switching circuit, and/or the user feedback device are contained inside the sealed housing.

24. The method of claim 22, wherein the sealed housing is sealed by ultrasonic welding.

25. The method of claim 16, wherein the first solid-state transducer comprises a piezoelectric micromechanical force-measuring element (PMFE).

26. The method of claim 16, wherein the digital bus is selected from: FC bus, LIN bus, CAN bus, SPI bus, and UART bus.

27. The method of claim 16, wherein the external system comprises a solar-power system.

28. The method of claim 16, wherein the method additionally comprises:
(B1) generating, by a second transducer, second signals in response to the perturbation; and
(B2) obtaining, by the microcontroller, second data from the second signals; and
(A3) comprises determining, by the microcontroller, the user inputs in accordance with at least the first data, the second data, and the operational state of the solid-state switch; and
the solid-state switch additionally comprises the second transducer.

29. The method of claim 28, wherein:
the first solid-state transducer comprises a piezoelectric micromechanical force-measuring element (PMFE);
the cover member is electrically non-conducting;
the solid-state switch comprises an elastic circuit board substrate mechanically coupled to the cover member;
the second transducer comprises one or more sensor electrodes positioned on or in an elastic circuit board substrate; and
the second data comprise (1) capacitance between at least one of the sensor electrodes and its surrounding environment (self-capacitance data) and/or (2) capacitance between a first one of the sensor electrodes and a second one of the sensor electrodes (mutual capacitance data).

30. The method of claim 29, wherein the second data comprise one or more of the following:
(1) a position of the perturbation at the cover member (perturbation position) in accordance with a map of the self-capacitance data;
(2) a comparison of a magnitude of the self-capacitance data to a self-capacitance threshold;
(3) a position of the perturbation at the cover member (perturbation position) in accordance with a map of the mutual capacitance data; and
(4) a comparison of a magnitude of the mutual capacitance data to a mutual capacitance threshold.

* * * * *